United States Patent
Taniguchi et al.

(10) Patent No.: US 10,806,037 B2
(45) Date of Patent: Oct. 13, 2020

(54) COMPONENT MOUNTING SYSTEM

(71) Applicant: Panasonic Intellectual Property Management Co., Ltd., Osaka (JP)

(72) Inventors: Masahiro Taniguchi, Fukuoka (JP); Satoshi Furuichi, Fukuoka (JP); Masahiro Kihara, Fukuoka (JP); Toshihiko Nagaya, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 324 days.

(21) Appl. No.: 15/848,034

(22) Filed: Dec. 20, 2017

(65) Prior Publication Data
US 2018/0192522 A1    Jul. 5, 2018

(30) Foreign Application Priority Data

Jan. 5, 2017 (JP) ................................ 2017-000321
Jan. 5, 2017 (JP) ................................ 2017-000323

(51) Int. Cl.
| | |
|---|---|
| *B23P 19/00* | (2006.01) |
| *H05K 3/30* | (2006.01) |
| *H05K 13/04* | (2006.01) |
| *H05K 13/08* | (2006.01) |

(52) U.S. Cl.
CPC ........... *H05K 3/30* (2013.01); *H05K 13/0417* (2013.01); *H05K 13/083* (2018.08); *Y10T 29/53178* (2015.01)

(58) Field of Classification Search
CPC .... H01L 21/486; H05K 13/0815; H05K 3/30; Y10T 29/53178; Y10T 29/4913; Y10T 29/53187; Y10T 29/49137; Y10T 29/53022; Y10T 29/53065; Y10T 29/53235; G05B 2219/36195
USPC .......... 29/740, 593, 729, 739, 743, 829, 833
See application file for complete search history.

(56) References Cited

U.S. PATENT DOCUMENTS 6,457,232 B1 * 10/2002 Isogai ................ H05K 13/0812
                                                                            29/833
9,204,586 B2 * 12/2015 Kato .................. H05K 13/0452

FOREIGN PATENT DOCUMENTS

JP                 4813445 B2      11/2011

* cited by examiner

*Primary Examiner* — Thiem D Phan
(74) *Attorney, Agent, or Firm* — Pearne & Gordon LLP

(57) ABSTRACT

A component mounting system includes a plurality of component supply devices (tape feeders) each of which supplies components from a component supply position and a component mounter that sucks the components from the component supply position of each of the plurality of component supply devices with a plurality of nozzles (suction nozzles) to install the components onto a board. A suction position correction value for correcting a suction position shift from a regular suction position when each of the nozzles sucks the components from the component supply position is calculated. The suction position is corrected based on the suction position correction value to suck the components. A suction position shift amount from the regular suction position is calculated. A feeder evaluation value, which is a sum of the suction position correction value and the suction position shift amount, is calculated for each of the plurality of component supply devices.

9 Claims, 17 Drawing Sheets

ΔXd, ΔYd, Δθd suction position shift amounts

FIG. 14

| Rxy Rank | Applicable component | | | | | |
|---|---|---|---|---|---|---|
| | 0201 | 03015 | 0402 | 0603 | 1005 | 1608 |
| A | ○ | ○ | ○ | ○ | ○ | ○ |
| B | | | ○ | ○ | ○ | ○ |
| C | | | | ○ | ○ | ○ |
| D | | | | | ○ | ○ |
| E | | | | | | ○ |
| F | | | | | | |

COMPONENT MOUNTING SYSTEM

BACKGROUND

1. Technical Field

The present disclosure relates to a component mounting system that sucks a component supplied by a component supply device with a nozzle to install onto a board and an evaluation method of a component supply device.

2. Description of the Related Art

In a component mounting system that installs a component onto a board, the component supplied to a component supply position by a tape feeder (component supply device) is sucked by a nozzle of a mounting head and is installed onto the board. Component feeding accuracy when the tape feeder supplies the component to the component supply position declines over time due to wear of a movable portion, such as a component feeding motor and a sprocket, and along with this, a component suction error proportion increases. A rank is assigned to the tape feeder based on component feeding accuracy and a suction error proportion, and a component that can be used is limited according to a rank (for example, refer to Japanese Patent No. 4813445).

In a component mounter (surface mounter) of Japanese Patent No. 4813445, during mounting work, a component supply position is imaged by a camera that integrally moves with a mounting head each time the tape feeder feeds a component and a variation amount (component feeding accuracy) of the position of a component pocket is acquired, and the rank of the tape feeder is determined based on component feeding accuracy and a suction error proportion (suction error).

SUMMARY

According to the disclosure, there is provided a component mounting system including a plurality of component supply devices each of which has a component supply position and supplies components from the component supply position, a component mounter that has a plurality of nozzles and sucks the components from the component supply position of each of the plurality of component supply devices with the plurality of nozzles to install the components onto a board, and a feeder evaluation value calculator that calculates a feeder evaluation value, which is a sum of a suction position correction value for correcting a suction position shift from a regular suction position when each of the nozzles sucks the components from the component supply position and a suction position shift amount from the regular suction position when the suction position is corrected based on the suction position correction value and the components are sucked, for each of the plurality of component supply devices.

According to the disclosure, there is provided an evaluation method of a component supply device in a component mounting system having: a plurality of component supply devices each of which has a component supply position and supplies components from the component supply position; and a component mounter which has a plurality of nozzles and sucks the components from the component supply position of each of the plurality of component supply devices with the plurality of nozzles to install the components onto a board. The method includes calculating a suction position correction value for correcting a suction position shift from a regular suction position when each of the nozzles sucks the components from the component supply position, sucking the components by correcting the suction position based on the suction position correction value, calculating a suction position shift amount from the regular suction position, and calculating a feeder evaluation value, which is a sum of the suction position correction value and the suction position shift amount, for each of the plurality of component supply devices.

According to the disclosure, the component feeding accuracy of the component supply devices can be evaluated without causing a decline in production efficiency.

BRIEF DESCRIPTION OF THE DRAWINGS

FIG. 14 is a view illustrating a relationship between a feeder rank of the tape feeder and an applicable component according to the exemplary embodiment of the disclosure;

DETAILED DESCRIPTION

Figure 1:
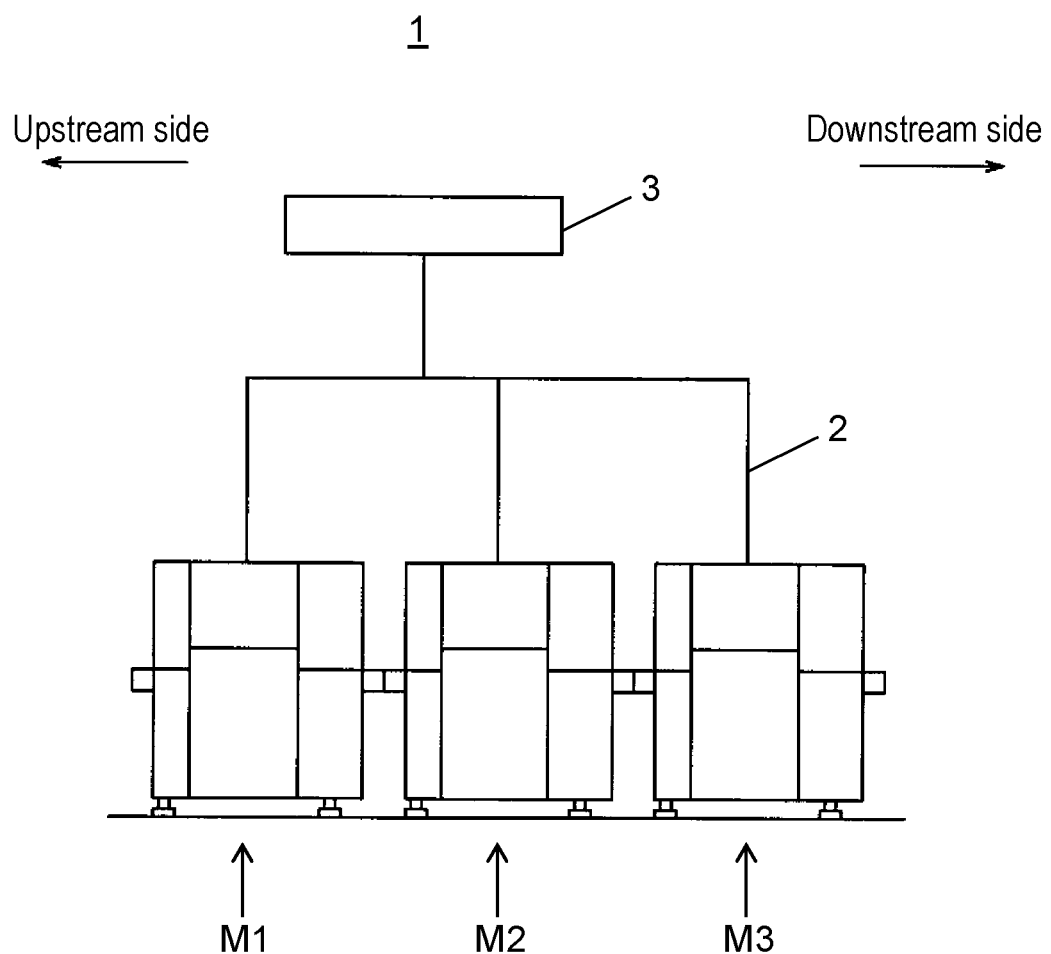
FIG. 1 is a view for illustrating a configuration of a component mounting system according to an exemplary embodiment of the disclosure.

Prior to the description of an exemplary embodiment, a problem of the related art will be briefly described.

In the related art including Japanese Patent No. 4813445, during mounting work, imaging at a component supply position is executed by a camera each time before component suction in addition to component suction operation. Thus, there is a problem that mounting time increases and production efficiency declines.

An object of the disclosure is to provide a component mounting system, which can evaluate the component feeding accuracy of a component supply device without causing a decline in production efficiency, and an evaluation method of a component supply device.

Hereinafter, an exemplary embodiment of the disclosure will be described in detail with reference to the drawings. Configurations and shapes to be described are merely examples for description, and are subject to change as appropriate according to the specification of a component mounting system, a component mounter, and a tape feeder (component supply device). Hereinafter, all of corresponding elements in the drawings will be assigned with the same reference signs and overlapping description will be omitted.

Figure 2:
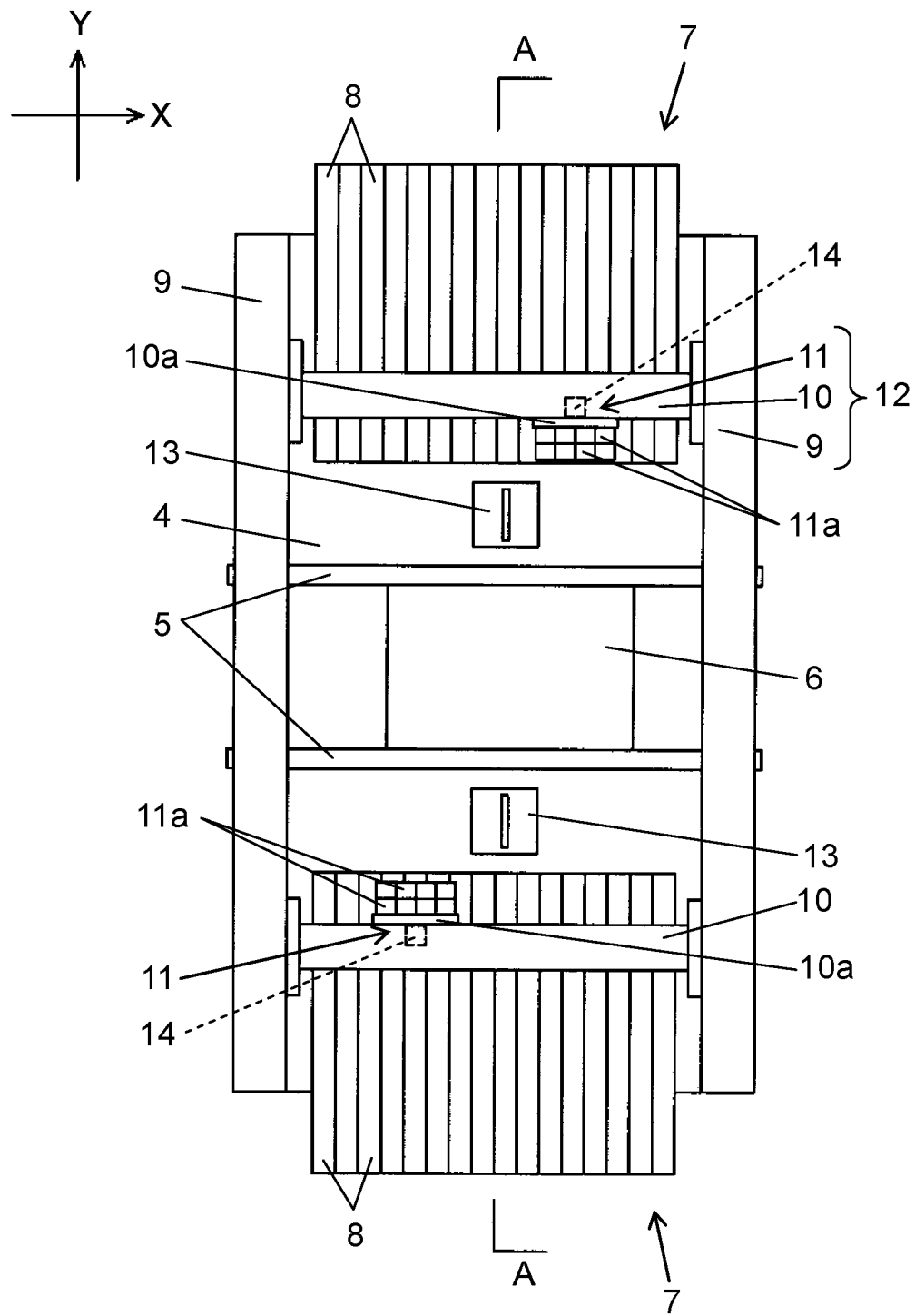
FIG. 2 is a plan view of a component mounter according to the exemplary embodiment of the disclosure.
Figure 3:
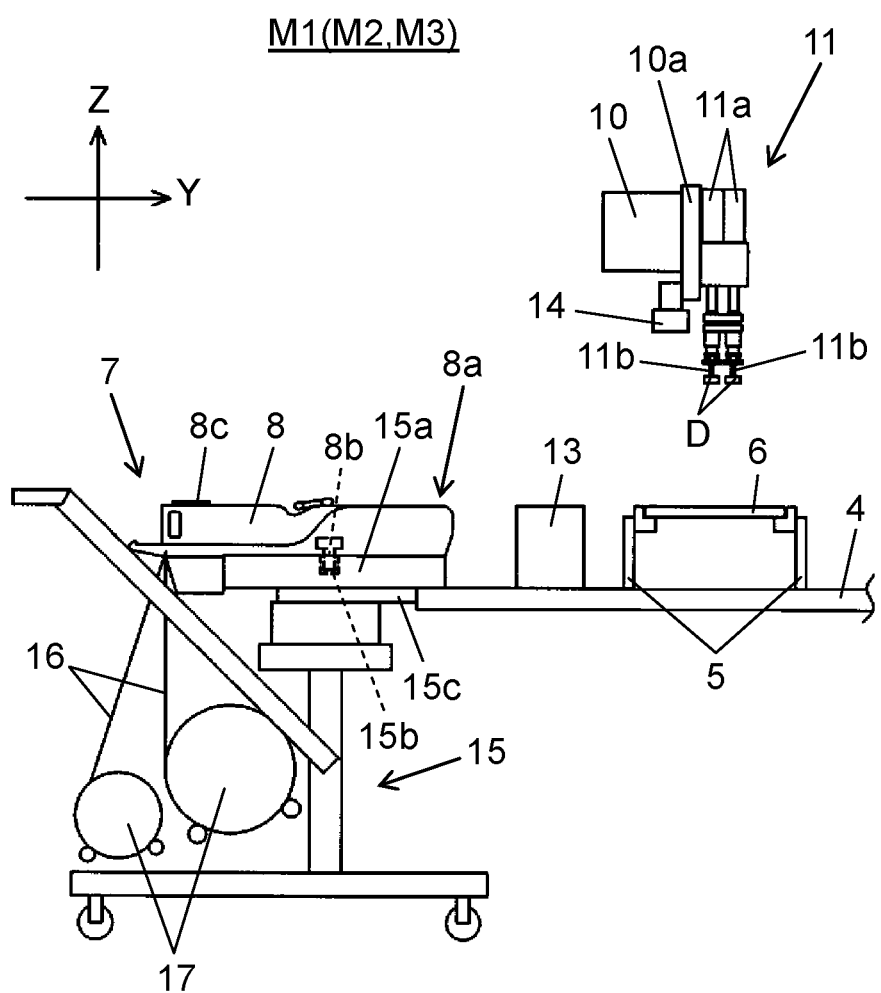
FIG. 3 is a partial sectional view of the component mounter according to the exemplary embodiment of the disclosure.

In FIG. 2 and some of the drawings to be described later, an X-direction (right-and-left direction in FIG. 2), which is a board transporting direction, and a Y-direction (up-and-down direction in FIG. 2), which is orthogonal to the board transporting direction, are illustrated as two axis-directions orthogonal to each other in a horizontal plane. In FIG. 3 and some of the drawings to be described later, a Z-direction (up-and-down direction in FIG. 3) is illustrated as a height direction orthogonal to the horizontal plane. The Z-direction is an up-and-down direction in a case where the component mounter is provided on the horizontal plane.

First, component mounting system 1 will be described with reference to FIG. 1. In FIG. 1, a configuration where communication network 2 connects component mounter M1, component mounter M2, and component mounter M3 together side by side from an upstream side to a downstream side in the board transporting direction and the entire system is controlled by management computer 3 is adopted for component mounting system 1. Component mounting system 1 has a function of mounting components onto boards and producing mount boards. The configuration of component mounting system 1 is not limited to an example illustrated in FIG. 1. For example, a configuration where four or more of component mounters M1 to M3 are provided side by side may be adopted, or a configuration where one or two of component mounters M1 to M3 are provided may be adopted.

Next, configurations of component mounters M1 to M3 will be described with reference to FIGS. 2 to 4. Component mounters M1 to M3 have the same configuration, and component mounter M1 will be described herein. FIG. 3 partially illustrates section A-A of FIG. 2. Component mounter M1 has a function of executing component mounting work of mounting components supplied from a component supplier onto a board. In the middle of base 4, board transport mechanism 5 is arranged in the X-direction. Board transport mechanism 5 brings in board 6 transported from the upstream side to a mounting work position and positions and holds the board. In addition, board transport mechanism 5 takes board 6 on which component mounting work is completed out to the downstream side.

Component suppliers 7 are disposed on both ends of board transport mechanism 5. A plurality of tape feeders 8 are installed in parallel in each of component suppliers 7. By tape feeders 8 pitch feeding carrier tape, in which pockets to accommodate components are formed, in a direction from the outside of component suppliers 7 to the board transport mechanism 5 (tape feeding direction), components are supplied to component supply positions 8a (refer to FIG. 3) where components are picked up by mounting heads of component mounters to be described below. That is, tape feeders 8 are component supply devices that have component supply positions 8a and supply components from component supply positions 8a.

At both end portions in the X-direction on a top surface of base 4, Y-axis beams 9 each including a linear drive mechanism are arranged along the Y-direction. Similarly, two X-axis beams 10 each including a linear drive mechanism are coupled to Y-axis beams 9 so as to move freely in the Y-direction. X-axis beams 10 are arranged along the X-direction. Mounting heads 11 are installed on two X-axis beams 10 respectively so as to move freely in the X-direction. Mounting heads 11 each include a plurality of suction units 11a that suction hold components and can be elevated. Suction nozzle 11b (refer to FIG. 3) that suction holds a component is installed on each of lower end portions of suction units 11a.

In FIG. 2, mounting heads 11 move in the X-direction and the Y-direction by Y-axis beams 9 and X-axis beams 10 being driven. Accordingly, two mounting heads 11, with suction nozzles 11b, suck and pick up components from component supply positions 8a of tape feeders 8, which are disposed in component suppliers 7 corresponding to the mounting heads respectively, and install the components at mounting points of board 6 positioned by board transport mechanism 5. That is, Y-axis beams 9, X-axis beams 10, and mounting heads 11 have the plurality of suction nozzles 11b (nozzles), and configure, with the plurality of suction nozzles 11b, component mounters 12 that suck components from component supply positions 8a of the plurality of tape feeders 8 (component supply devices) to install onto board 6.

Each of component recognition cameras 13 is arranged between each of component suppliers 7 and board transport mechanism 5. When mounting heads 11 that have picked up components from component suppliers 7 move above component recognition cameras 13, component recognition cameras 13 image the components held by mounting heads 11 to recognize the orientations in which the components are held. Board recognition cameras 14 are attached to plates 10a to which mounting heads 11 are attached. Board recognition cameras 14 move integrally with mounting heads 11.

As mounting heads 11 move, board recognition cameras 14 move above board 6 positioned by board transport mechanism 5 and image a board mark (not illustrated) provided on board 6 to recognize the position of board 6. In addition, board recognition cameras 14 move above component supply positions 8a of tape feeders 8 to recognize the state of carrier tape in the vicinity of component supply positions 8a. In component mounting operation by mounting heads 11 onto board 6, a mounting position is corrected in consideration of component recognition results from component recognition cameras 13 and board position recognition results from board recognition cameras 14.

As illustrated in FIG. 3, carriages 15, which are in a state where the plurality of tape feeders 8 are installed on feeder bases 15a in advance, are set for component suppliers 7. A plurality of positioning holes 15b corresponding to installed tape feeders 8 are arranged in top surfaces of feeder bases 15a (also refer to FIG. 15B). Positioning pins 8b are arranged on bottom surfaces of tape feeders 8 so as to protrude downwards. When installing tape feeders 8 on feeder bases 15a, positioning pins 8b are inserted into positioning holes 15b. Accordingly, the positions of tape feeders 8 on feeder bases 15a are fixed.

Positioning pins 8b each are configured of an eccentric pin capable of adjusting the central position of positioning pin 8b in a direction (X-direction in a state where tape feeder 8 is installed on component mounter M1) orthogonal to the tape feeding direction of tape feeder 8. That is, positions (feeder positions) where tape feeders 8 are installed on feeder bases 15a can be adjusted by changing the central positions of positioning pins 8b. The positions of carriages 15 are fixed with respect to component suppliers 7 by clamp mechanisms 15c clamping feeder bases 15a to a fixing base (not illustrated) provided in base 4.

In FIG. 3, operation and display panel 8c connected to feeder controller 50 (refer to FIG. 12) is disposed on a top surface of tape feeder 8 on an upstream side in the tape feeding direction. Various types of operation buttons such as operation buttons for operating tape feeding operation are provided on operation and display panel 8c. In addition, displays 52 (refer to FIG. 12), such as an LED and a liquid crystal display screen, which display the operation condition and feeder ranks of tape feeders 8 to be described later, are provided on operation and display panels 8c.

Tape reels 17, which accommodate carrier tape 16 holding components D in a state of being wound around, are held by carriage 15. Tape feeders 8 pitch feed carrier tape 16 pulled out from tape reels 17 to component supply positions 8a with respect to suction nozzles 11b.

Figure 4A:
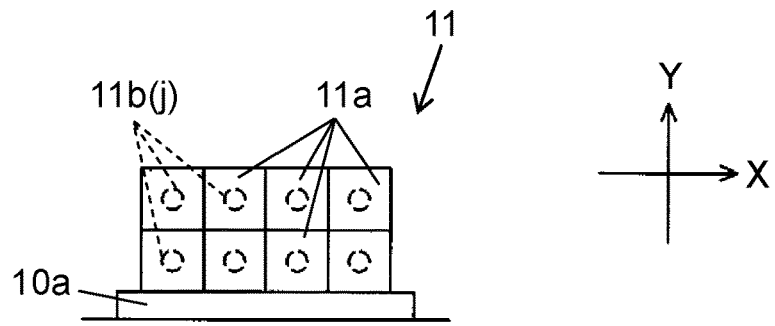
FIG. 4A is a plan view of a mounting head included in the component mounter according to the exemplary embodiment of the disclosure.
Figure 4B:
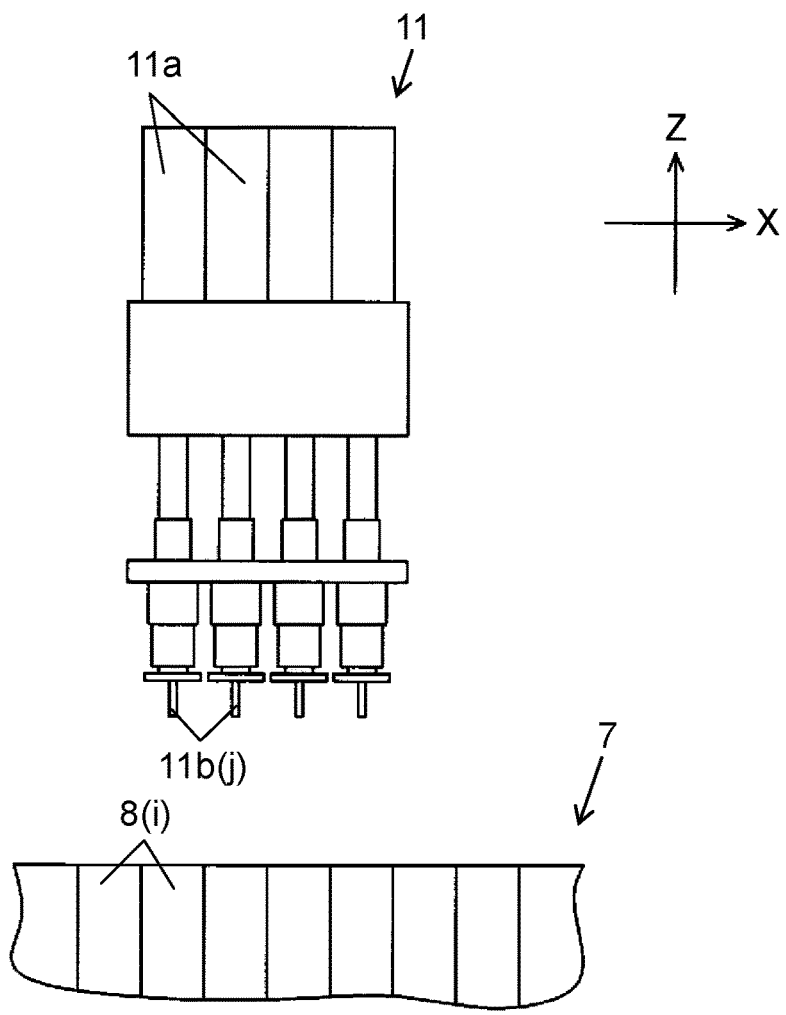
FIG. 4B is a front view of the mounting head included in the component mounter according to the exemplary embodiment of the disclosure.

In FIGS. 4A and 4B, in component mounting operation by mounting head 11, any one of a plurality of suction nozzles 11b (j) included in mounting head 11 picks up component D from any one of a plurality of tape feeders 8 (i) arrayed in component suppliers 7 to mount onto board 6. In this component mounting operation, a combination of suction nozzle 11b (j) and tape feeder 8 (i) is designated for one mounting turn, in which mounting head 11 reciprocates between board 6 and component supplier 7 one time, in mount sequence data.

Figure 5:
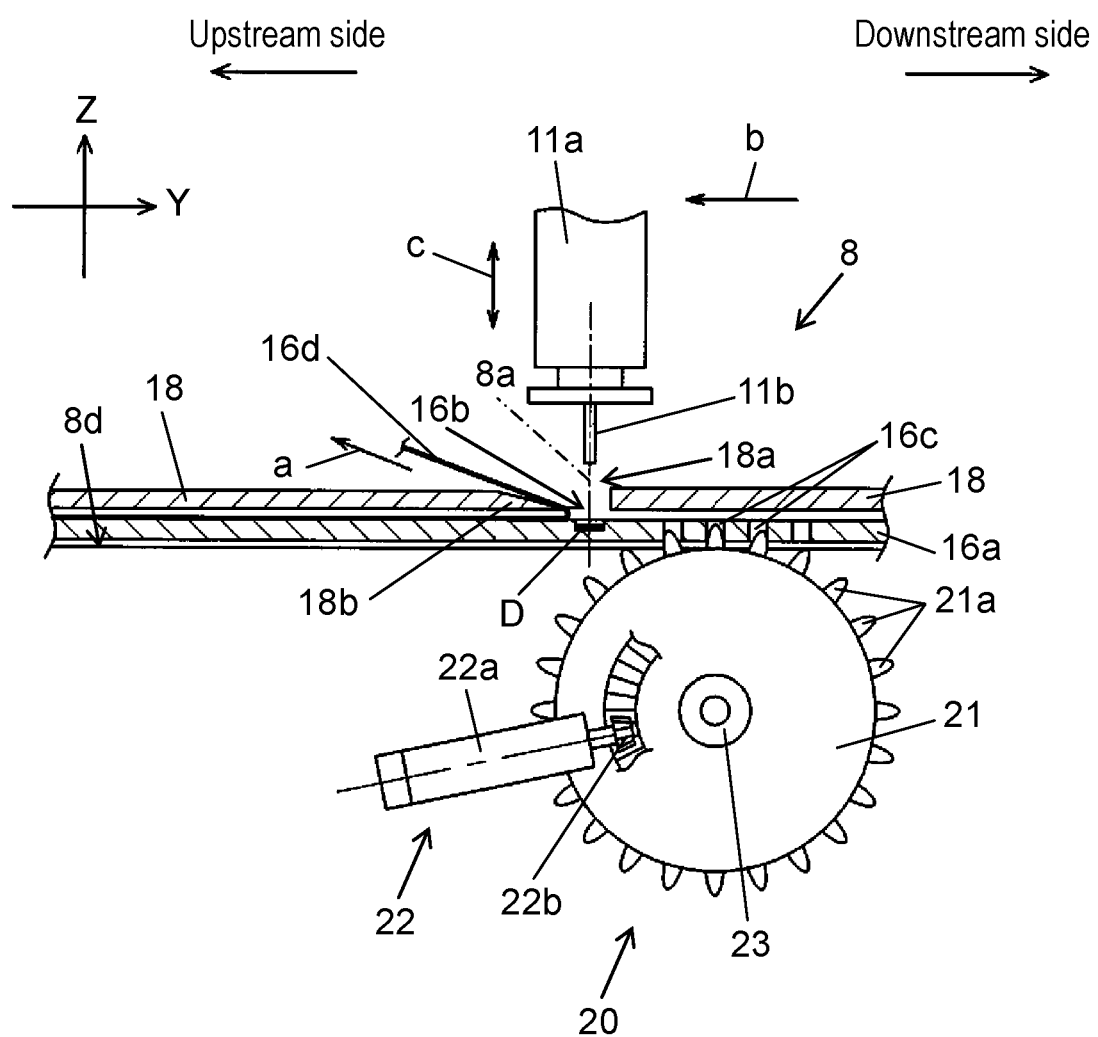
FIG. 5 is a view for illustrating a configuration of a tape feed mechanism of a tape feeder included in the component mounter according to the exemplary embodiment of the disclosure.
Figure 6A:
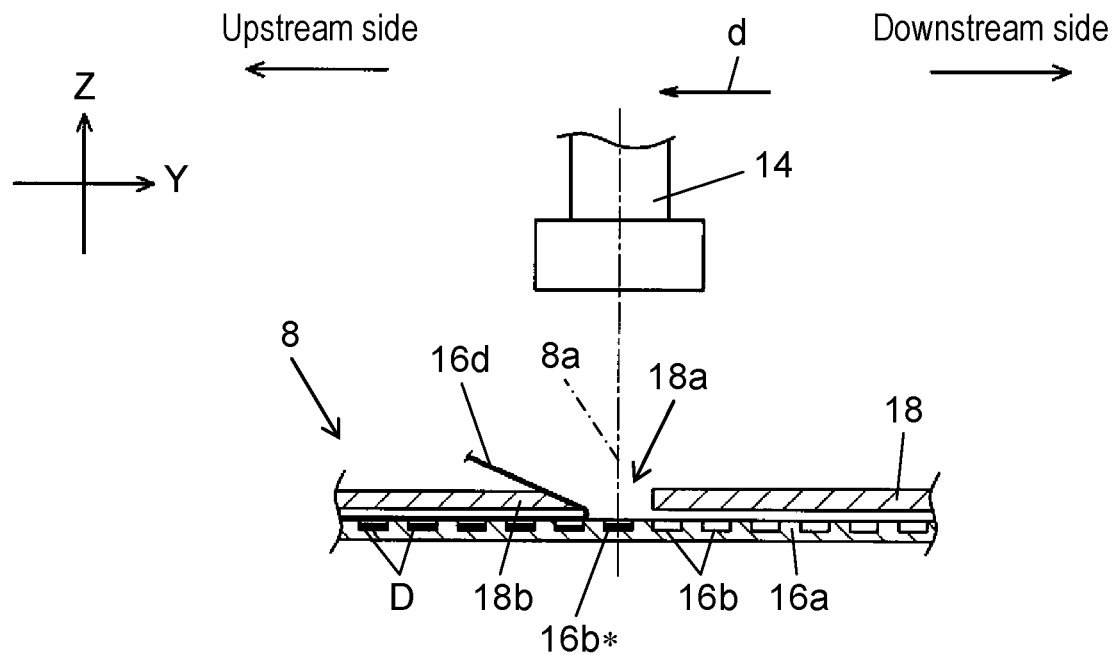
FIG. 6A is a view for illustrating imaging of a pocket, which is pitch fed to a component supply position of the tape feeder included in the component mounter according to the exemplary embodiment of the disclosure, by a board recognition camera.
Figure 6B:
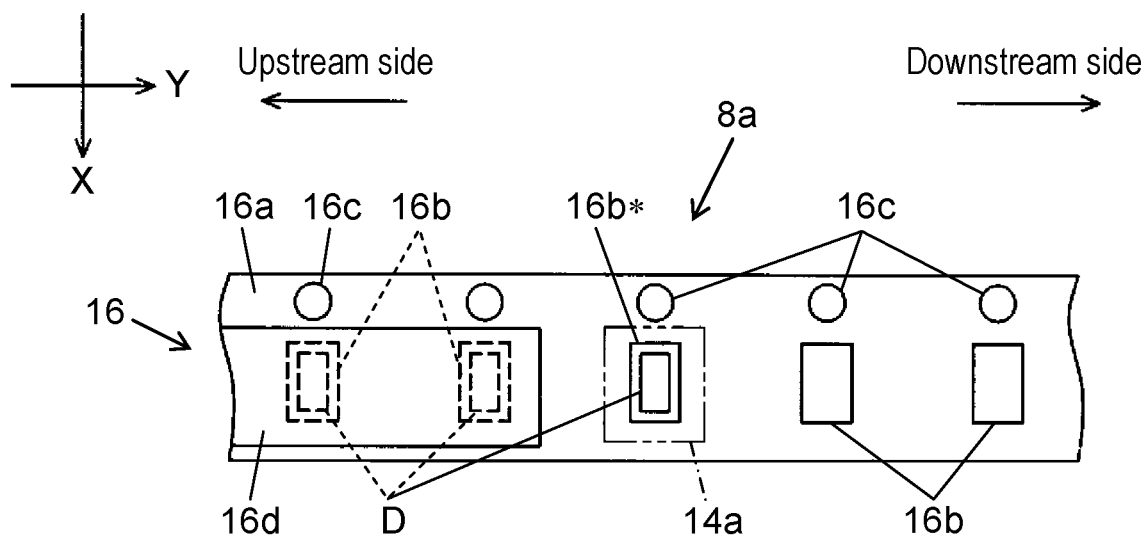
FIG. 6B is a view for illustrating a structure of carrier tape pitch fed to the component supply position of the tape feeder included in the component mounter according to the exemplary embodiment of the disclosure.

Next, the structure of tape feeders 8 and pitch feeding operation will be described with reference to FIGS. 5 and 6B. FIG. 5 is a partial sectional view schematically illustrating the vicinity of component supply position 8a of tape feeder 8. Tape guideway 8d is provided in tape feeder 8, and carrier tape 16 is fed to the downstream side (the right in FIG. 5) along a top surface of tape guideway 8d. Pressing member 18 that guides carrier tape 16 from above is arranged on an upper portion of tape feeder 8. Opening 18a is provided in pressing member 18 positioned at component supply position 8a.

Herein, the structure of carrier tape 16 will be described with reference to FIG. 6B. FIG. 6B illustrates a state where carrier tape 16 in the vicinity of component supply position 8a is seen from above, and the illustration of pressing member 18 is omitted. Recessed pockets 16b accommodating components D and feed holes 16c engaging with feed pins 21a (refer to FIG. 5) of sprocket 21 that pitch feeds carrier tape 16 are formed at equal intervals in base tape 16a of carrier tape 16. Cover tape 16d is adhered to top surfaces of pockets 16b accommodating components D.

In FIG. 5, tape feed mechanism 20 for pitch feeding carrier tape 16 is provided on the downstream side of tape feeder 8. Tape feed mechanism 20 includes sprocket 21 disposed in orientation which is horizontal to an axial line, drive mechanism 22 that rotation-drives sprocket 21, and rotary encoder 23 that detects the rotation position of sprocket 21. Drive mechanism 22 is configured so as to include motor 22a and bevel gear 22b. Sprocket 21 is rotation-driven by motor 22a via bevel gear 22b, and performs intermittent rotation operation corresponding to pitch feeding operation.

Feed pins 21a are provided at equal pitches on the circumference of sprocket 21. Tape feed mechanism 20 is controlled by feeder controller 50. In a state where feed pins 21a are fitted into feed holes 16c provided in carrier tape 16, sprocket 21 rotates intermittently and carrier tape 16 is pitch fed (tape feeding) to the downstream side by feeder controller 50 rotation-driving motor 22a based on detection results of the rotation position from rotary encoder 23. A rotation position (position where carrier tape 16 stops in the Y-direction) where sprocket 21 stops during pitch feeding is adjusted depending on parameters given to feeder controller 50.

Carrier tape 16, which has been pitch fed on tape guideway 8d, reaches component supply position 8a. In this process, cover tape 16d adhered to carrier tape 16 is folded in a tape feeding opposite direction (arrow a) by edge 18b (peeler) of opening 18a. Therefore, upper portions of pockets 16b on the downstream side (the right of FIG. 5)

including component supply position 8a are opened. When picking up component D from pocket 16b, a lower end of suction nozzle 11b abuts against and vacuum-sucks the top surface of component D to pick up the component with suction nozzles 11b moving above component supply position 8a (arrow b) and being elevated (arrow c).

Next, the imaging of pockets 16b (hereinafter, referred to as "target pockets 16b*"), which have been pitch fed to component supply positions 8a, by board recognition cameras 14 will be described with reference to FIG. 6A. Board recognition camera 14 moves above component supply position 8a (arrow d) by Y-axis beam 9 and X-axis beam 10 being driven and images target pocket 16b* at component supply position 8a through opening 18a.

Next, an example of a pocket image of target pocket 16b* captured by board recognition camera 14 will be described with reference to FIGS. 7A and 7B. Immediately after installing tape feeder 8 in component supplier 7 or immediately after installing carrier tape 16 on tape feeder 8, the imaging of target pocket 16b* by board recognition camera 14 is executed for an instruction to correct the suction position of component D for suction nozzle 11b.

In response to an instruction, a relative position shift from an initial position (position that is expected in a case where there is no position shift) of target pocket 16b* of which component D is to be sucked is corrected for board recognition camera 14. Causes of a relative position shift includes a position shift (position shift of positioning pin 8b), which is a shift in the feeder position in a state where tape feeder 8 is installed in component supplier 7, a tape feeding position shift attributable to deformation of sprocket 21, a tape feeding stop position shift attributable to wear of configuration elements of drive mechanism 22, a relative position shift of feed hole 16c and pocket 16b attributable to the processing accuracy of carrier tape 16, and a position shift of mounting head 11 (board recognition camera 14) attributable to deformation of Y-axis beam 9 and X-axis beam 10.

Figure 7A:
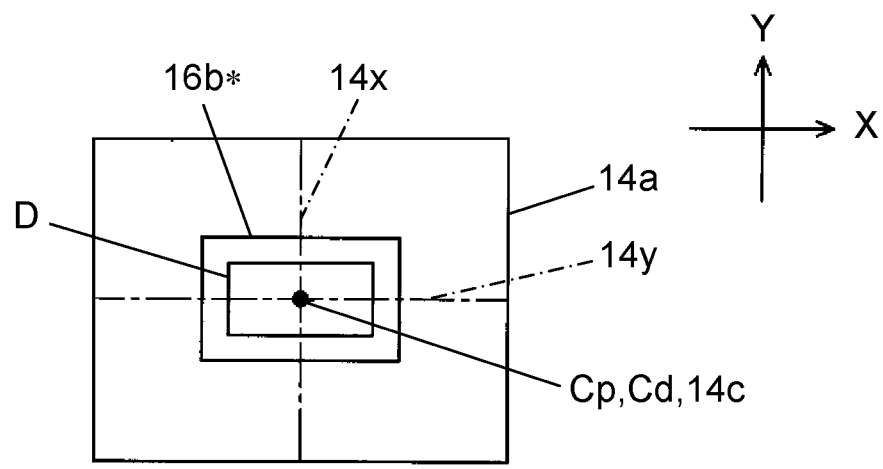
FIG. 7A is a view for illustrating an example in which a pocket center of the tape feeder included in the component mounter according to the exemplary embodiment of the disclosure is not shifted from a center of a pocket image.

FIG. 7A illustrates an example in which there is no relative position shift of target pocket 16b*, component D, and board recognition camera 14. That is, center 14c of imaging visual field 14a (also refer to FIG. 6B) of board recognition camera 14 moved to the initial position matches pocket center Cp of target pocket 16b* and component center Cd of component D. Center line 14x in the X-direction is displayed so as to superimpose center line 14y in the Y-direction in imaging visual field 14a. Each of pocket center Cp of target pocket 16b* and component center Cd of component D matches center 14c of imaging visual field 14a (intersection of center line 14x in the X-direction and center line 14y in the Y-direction). Center 14c of imaging visual field 14a is the initial position of pocket center Cp of target pocket 16b* expected in a case where there is no position shift.

Figure 7B:
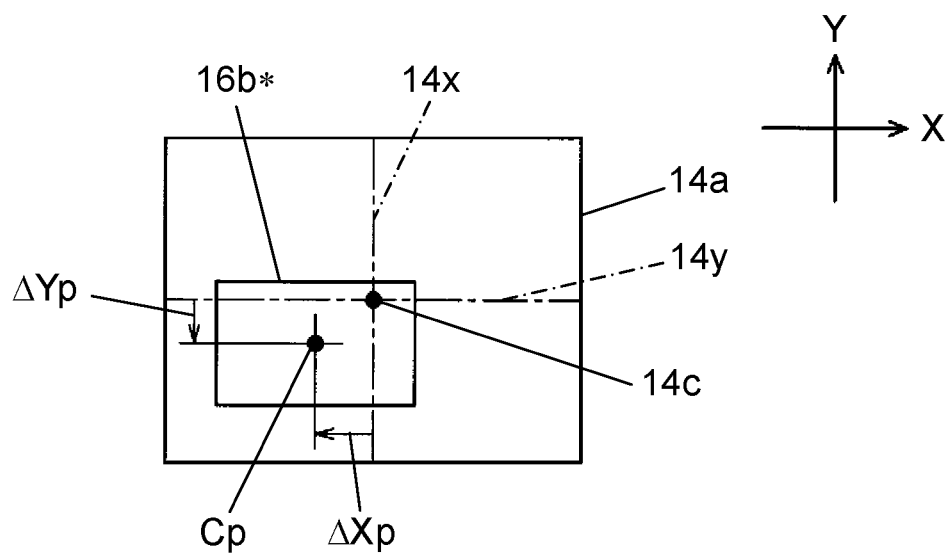
FIG. 7B is a view for illustrating an example in which the pocket center of the tape feeder included in the component mounter according to the exemplary embodiment of the disclosure is shifted from the center of the pocket image.

FIG. 7B illustrates an example in which the position of center 14c of imaging visual field 14a of board recognition camera 14 moved to the initial position is shifted from pocket center Cp of target pocket 16b*. Pocket center Cp is extracted by recognition processor 32 (refer to FIG. 11) recognition-processing the captured pocket image of target pocket 16b*, and pocket position shift amounts ΔXp and ΔYp indicating position shift amounts of pocket center Cp in the X-direction and the Y-direction from center 14c of imaging visual field 14a are calculated. In response to an instruction, the position of mounting head 11 when the suction nozzle 11b sucks component D is corrected based on calculated pocket position shift amounts ΔXp and ΔYp. In FIG. 7B, the illustration of component D accommodated in target pocket 16b* is omitted for convenience of description.

Figure 8A:
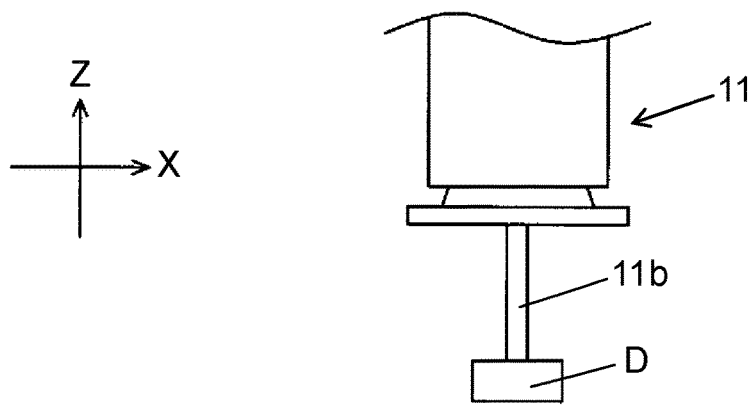
FIG. 8A is a view for illustrating suction position shift detection in the component mounter according to the exemplary embodiment of the disclosure.
Figure 8A:
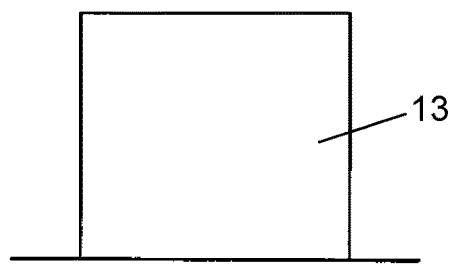

Next, component recognition by component recognition cameras 13 will be described with reference to FIGS. 8A and 8B. In component mounting operation by mounting head 11, scan operation, in which mounting head 11 suction holding component D with suction nozzle 11b is moved above component recognition camera 13 in a predetermined direction, is performed as illustrated in FIG. 8A. Accordingly, an image of component D in a state of being suction held by suction nozzle 11b is acquired.

Figure 8B:
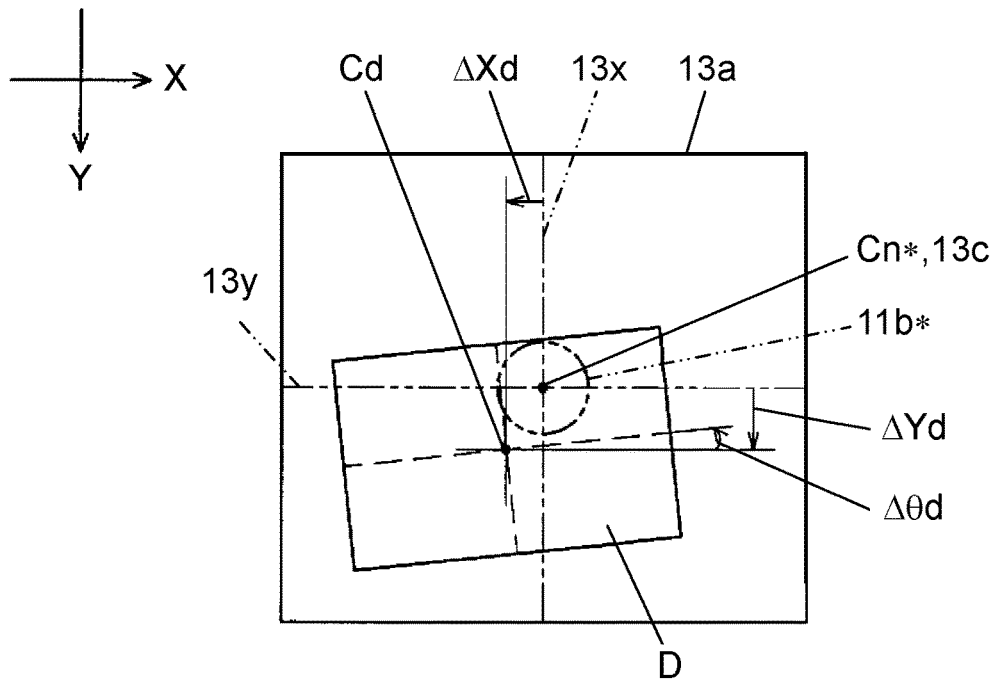
FIG. 8B is a view for illustrating an example of a component recognition image in the component mounter according to the exemplary embodiment of the disclosure.

FIG. 8B illustrates an example of component recognition image 13a captured after mounting head 11 is moved such that nozzle center Cn*, which is the center position of suction nozzle 11b* in a regular state expected to be positioned after an instruction, matches center 13c of component recognition image 13a. In component recognition image 13a, center line 13x in the X-direction is displayed so as to superimpose on center line 13y in the Y-direction, and an intersection of center line 13x in the X-direction and center line 13y in the Y-direction is center 13c of component recognition image 13a.

Component center Cd, which is the center position of component D, is extracted by recognition processor 32 recognition-processing component recognition image 13a, and suction position shift amounts ΔXd, ΔYd, and Δθd indicating position shift amounts of component center Cd in the X-direction, the Y-direction, and a θ-direction from center 13c of component recognition image 13a are calculated. The θ-direction is a direction of rotation with an axis in the Z-direction (Z-axis) being as the rotation axis. A suction position shift occurs due to a variation in the stop position of carrier tape 16 (target pocket 16b*) pitch fed by tape feeder 8, a variation in the position or orientation of component D in target pocket 16b*, a variation in the suction position when suction nozzle 11b sucks component D, a position shift of mounting head 11 attributable to deformation of Y-axis beam 9 and X-axis beam 10, and deformation of sprocket 21.

Figure 9:
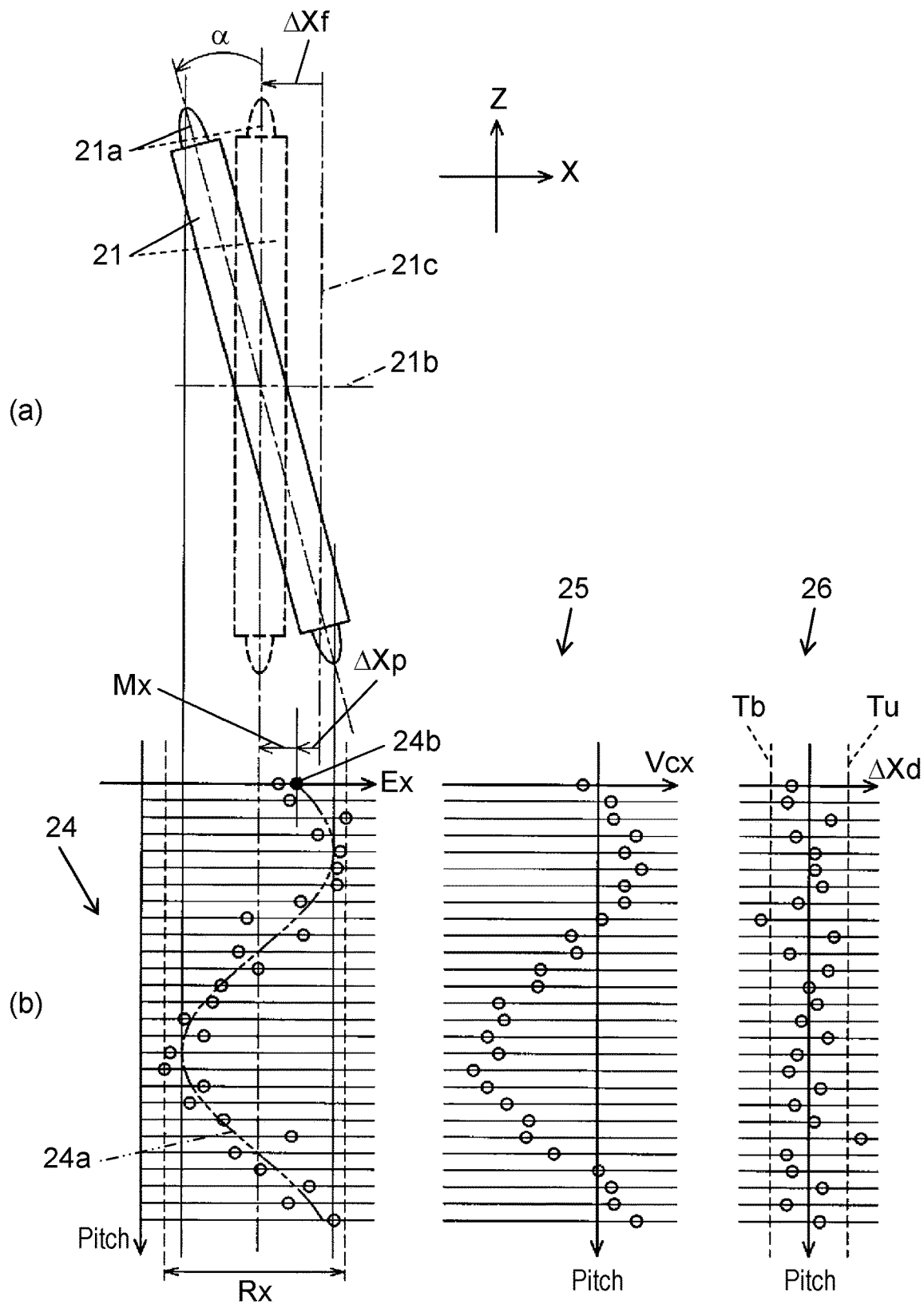
FIG. 9 is a view for illustrating distortion of a sprocket of the tape feed mechanism of the tape feeder included in the component mounter according to the exemplary embodiment of the disclosure and is a view for illustrating an example of a feeder evaluation value, a suction position correction value, and a suction position shift amount in an X-direction.

Next, an effect of deformation of sprocket 21 on a position shift in the X-direction (direction orthogonal to the tape feeding direction of tape feeders 8) of the supply position of component D on tape feeder 8 will be described with reference to FIG. 9. Sprocket 21 seen in the Y-direction is schematically illustrated in (a) of FIG. 9. The position of sprocket 21 is shifted in the X-direction by feeder position shift amount ΔXf from middle position 21c of sprocket 21 expected in a case where there is no shift in the feeder position of tape feeder 8. The sprocket is inclined from the Z-direction by maximum angle α, and rotates about axial line 21b as a rotation axis.

Graph 24 showing an example of the supply position (feeder evaluation value Ex to be described later) of component D in the X-direction at each tape feeding pitch, graph 25 showing an example of suction position correction value Vcx in the X-direction at each tape feeding pitch, and graph 26 showing an example of suction position shift amount ΔXd in the X-direction at each tape feeding pitch are horizontally displayed side by side in line with the position of a pitch in (b) of FIG. 9. When an instruction is given for a tape feeding pitch of black circle 24b shown at the top of graph 24, the distance of pocket center Cp of target pocket 16b* from middle position 21c of sprocket 21 expected in a case where there is no position shift is calculated as pocket position shift amount ΔXp in the X-direction.

As shown in graph 24, clue to inclination (deformation) of sprocket 21, position 24b of feed pin 21a of sprocket 21, which is engaged with feed hole 16c of carrier tape 16, in the X-direction periodically fluctuates and the position of target pocket 16b* also periodically fluctuates in the X-direction. In addition to periodic fluctuations in the position of target pocket 16b*, a position shift of component D within target pocket 16b* and a variation in the suction position when suction nozzle 11b sucks component D are superimposed on feeder evaluation values Ex, which are the positions of components D in the X-direction indicated by white circles in graph 24.

White circles of graph 25 indicate suction position correction values Vcx, which are correction values of suction positions for sucking components D. Correction value calculator 30b (refer to FIG. 11) of controller 30 calculates suction position correction value Vcx for each tape feeding pitch so as to correct suction position shift amount ΔXd calculated from component recognition image 13a obtained by component recognition camera 13. Then, mounting controller 30a of controller 30 corrects the suction position of next component D for suction nozzle 11b based on calculated suction position correction value Vcx.

White circles of graph 26 indicate suction position shift amounts ΔXd from the regular suction position of component D. Suction position shift amounts ΔXd beyond upper limit threshold Tu and lower limit threshold Tb shown in graph 26 are dealt as outliers, and are not used in calculating suction position correction value Vcx. Range Rx (variation range), which is an interval between the maximum value and minimum value of feeder evaluation value Ex shown in graph 24, and average value Mx are indicators for evaluating the component feeding accuracy of tape feeder 8.

Similarly, range Ry (variation range), which is an interval between the maximum value and minimum value of the supply position (feeder evaluation value Ey to be described later) of component D in the Y-direction (tape feeding direction of tape feeder 8) at each tape feeding pitch, and average value My are indicators for evaluating the component feeding accuracy of tape feeder 8. When configuration elements of drive mechanism 22 such as motor 22a and bevel gear 22b wear, range Ry and average value My of feeder evaluation value Ey become larger. When component feeding accuracy declines, suction position shift amounts ΔXd and ΔYd increase and a suction error and a mounting position shift increase. Thus, there is a possibility that the quality of a mount board declines. When the component feeding accuracy aggravates so as to be lower than a predetermined rank, maintenance of tape feeder 8 is carried out.

Figure 10:
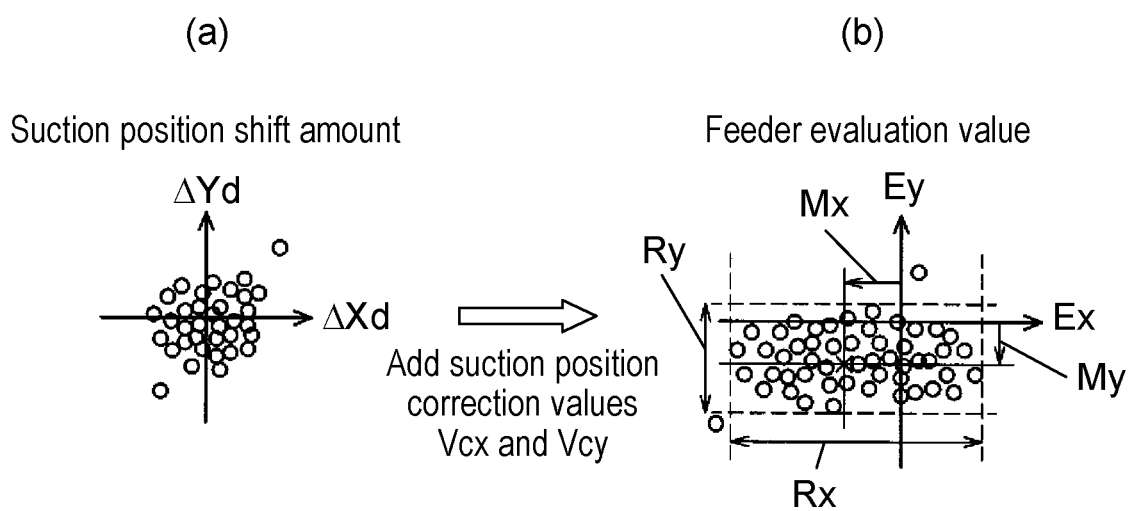
FIG. 10 is a scatter diagram of the suction position shift amount in the tape feeder included in the component mounter according to the exemplary embodiment of the disclosure and is a scatter diagram of the feeder evaluation value.

(a) of FIG. 10 shows an example of a scatter diagram in which X-components and Y-components of suction position shift amounts ΔXd, ΔYd, and Δθd accumulated in storage 31 (refer to FIG. 11) of component mounter M1 in component mounting work by component mounter M1 are collected for each of tape feeders 8 (i). (b) of FIG. 10 shows a scatter diagram of feeder evaluation values Ex and Ey obtained by adding suction position correction values Vcx and Vcy used when sucking components D to the X-components and Y-components of suction position shift amounts ΔXd, ΔYd, and Δθd of (a) of FIG. 10. Ranges Rx and Ry (variation ranges) of feeder evaluation values Ex and Ey and the X-components of average values Mx and My shown in (b) of FIG. 10 are the same as range Rx and average value Mx shown in (b) of FIG. 9.

In component mounting work, suction position shift amounts ΔXd, ΔYd, and Δθd are acquired in order to correct a mounting position where component D is mounted onto board 6. In addition, suction position correction values Vcx and Vcy are calculated based on pocket position shift amounts ΔXp and ΔYp and X-components and Y-components of suction position shift amounts ΔXd, ΔYd, and Δθd in order to correct a suction position where suction nozzle 11b sucks component D. That is, ranges Rx and Ry (variation ranges) and average values Mx and My of feeder evaluation values Ex and Ey, which are indicators for evaluating the component feeding accuracy of tape feeder 8, can be calculated based on data acquired and calculated for component mounting work.

Next, a configuration of a control system of component mounting system 1 will be described with reference to FIGS. 11 and 12. Component mounters M1 to M3 have the same configuration, and component mounter M1 will be described herein. First, a configuration of a control system of component mounter M1 will be described with reference to FIG. 11. Controller 30 is an overall control device for component mounter 1, and executes processing programs stored in storage 31 to control each unit such as board transport mechanism 5, component suppliers 7, component mounters 12, input 33, display 34, and communicator 35. Input 33 is an input device, such as a keyboard, a touch panel, and a mouse, and used when inputting an operation command and data. Display 34 is a display device, such as a liquid crystal panel, and displays various types of operation screens and various types of data.

Storage 31 stores various types of data used in component mounting work such as mount data 31a, pocket position shift amount data 31b, suction position shift amount data 31c, and suction position correction value data 31d. Mount data 31a is data such as the type of component D to be mounted and a mounting point on board 6, and is stored for each board type, which is a production target.

Figure 11:
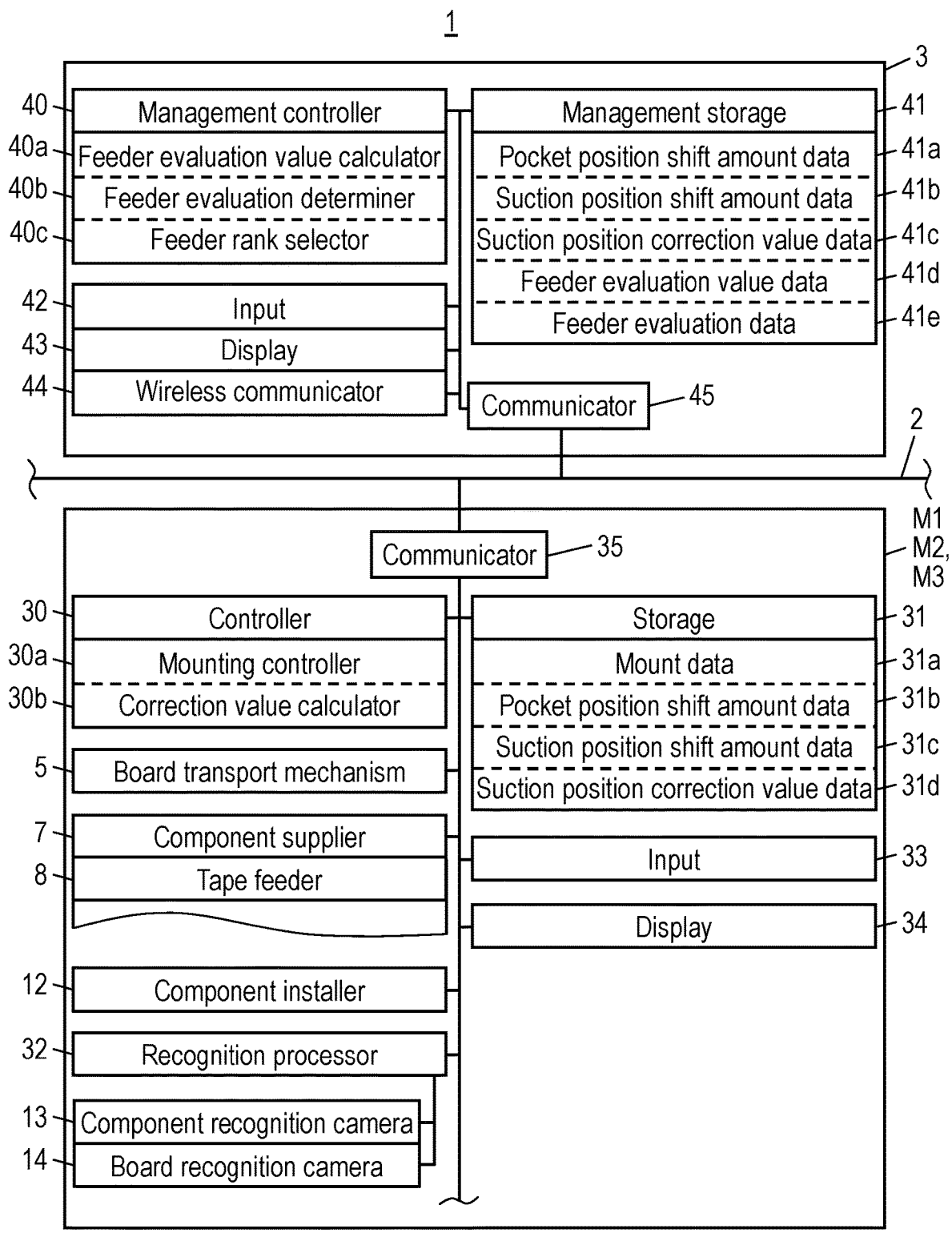
FIG. 11 is a block diagram showing a configuration of a control system of a component mounting line according to the exemplary embodiment of the disclosure.
Figure 12:
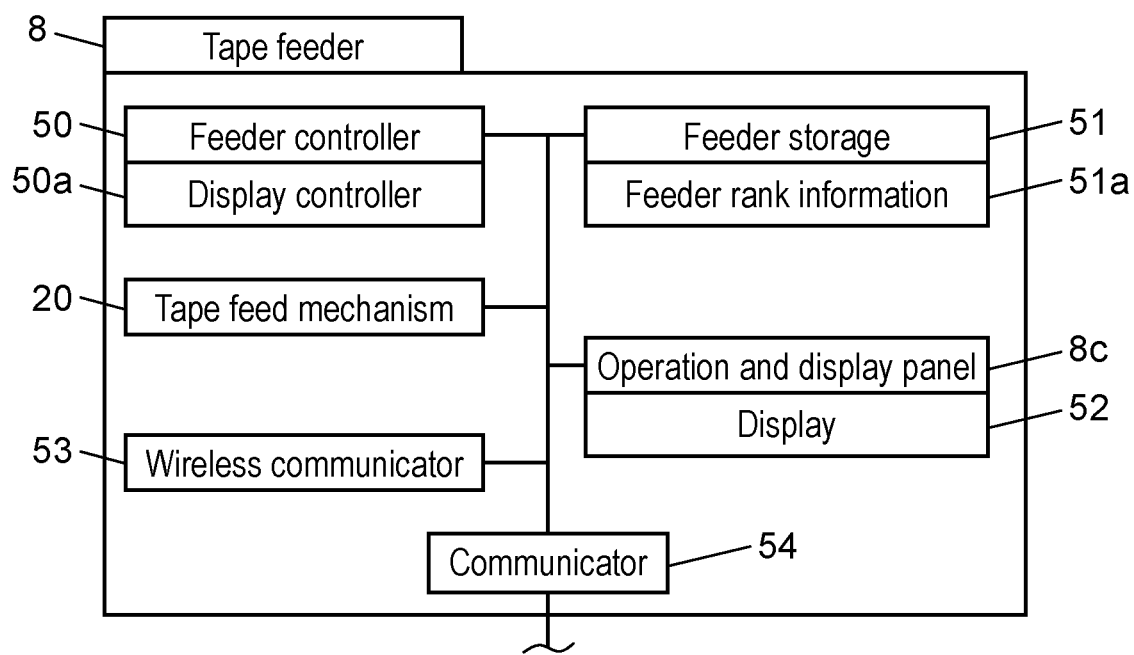
FIG. 12 is a block diagram showing a configuration of a control system of the tape feeder according to the exemplary embodiment of the disclosure.

In FIG. 11, controller 30 includes recognition processor 32, mounting controller 30a, and correction value calculator 30b for internal processing function. Recognition processor 32 calculates pocket position shift amounts ΔXp and ΔYp by recognition-processing the pocket image of target pocket 16b* captured by board recognition camera 14. Calculated pocket position shift amounts ΔXp and ΔYp are stored in storage 31 as pocket position shift amount data 31b.

In addition, recognition processor 32 calculates suction position shift amounts ΔXd, ΔYd, and Δθd by recognition-processing component recognition image 13a captured by component recognition camera 13. The imaging of component D by component recognition camera 13 is executed for each turn of operation, in which component mounter 12 sucks component D from component supply position 8a of tape feeder 8 (component supply device) of component supplier 7 and installs the component onto board 6 held by board transport mechanism 5, and suction position shift amounts ΔXd, ΔYd, and Δθd are calculated each time. Calculated suction position shift amounts ΔXd, ΔYd, and Δθd are stored in storage 31 as suction position shift amount data 31c.

In FIG. 11, correction value calculator 30b calculates suction position correction values Vcx and Vcy when suction nozzle 11b sucks component D based on pocket position shift amounts ΔXp and ΔYp stored as pocket position shift amount data 31b and suction position shift amounts ΔXd, ΔYd, and Δθd stored as suction position shift amount data 31c. That is, correction value calculator 30b calculates suction position correction values Vcx and Vcy for correcting a suction position shift from the regular suction position when suction nozzle 11b (nozzle) suck component D from component supply position 8a. In addition, suction position shift amounts ΔXd, ΔYd, and Δθd are position shift amounts from the regular suction position when the suction position is corrected based on suction position correction values Vcx and Vcy and components D are sucked.

When correction value calculator 30b calculates suction position correction values Vcx and Vcy, suction position correction values Vcx and Vcy may be calculated for each combination of the plurality of suction nozzles 11b (j) (nozzles) and the plurality of tape feeders 8 (i) (component supply devices). Accordingly, an effect of a shift in the suction position of each of suction nozzles 11b (j) attributable to distortion of suction nozzles 11b (j) can be eliminated and appropriate suction position correction values Vcx and Vcy can be calculated.

In FIG. 11, mounting controller 30a controls component mounting work of picking up components D from component suppliers 7 and mounting the components onto board 6 by controlling each unit such as board transport mechanism 5, component suppliers 7, and component mounters 12. At this time, mounting controller 30a corrects the suction position based on suction position correction values Vcx and Vcy included in suction position correction value data 31d and corrects the mounting position based on suction position shift amounts $\Delta Xd$, $\Delta Yd$, and $\Delta \theta d$ included in suction position shift amount data 31c.

Communicator 35 is a communication interface; and transmits and receives a signal and data to and from management computer 3 and other component mounters M2 and M3 via communication network 2. Pocket position shift amount data 31b, suction position shift amount data 31c, and suction position correction value data 31d are stored in a storage of component mounter M1, are transmitted to management computer 3 via communicator 35, and are stored in management storage 41 of management computer 3 as pocket position shift amount data 41a, suction position shift amount data 41b, and suction position correction value data 41c.

In FIG. 11, management computer 3 includes management controller 40, management storage 41, input 42, display 43, wireless communicator 44, and communicator 45. Management controller 40 is an arithmetic device such as a CPU and has feeder evaluation value calculator 40a, feeder evaluation determiner 40b, and feeder rank selector 40c as internal processors. Management storage 41 is a storage device and stores pocket position shift amount data 41a, suction position shift amount data 41b, suction position correction value data 41c, feeder evaluation value data 41d, and feeder evaluation data 41e in addition to component mount data for controlling component mounting system 1.

Input 42 is an input device, such as a keyboard, a touch panel, and a mouse, and used when inputting data such as an operation command and feeder rank selection. Display 43 is a display device, such as a liquid crystal panel, and displays notification information and an operation screen in addition to various types of data. Wireless communicator 44 transmits and receives a signal and data to and from tape feeders 8 through wireless communication. Communicator 45 is a communication interface, and transmits and receives a signal and data to and from component mounters M1 to M3 via communication network 2. In addition to wireless communication by wireless communicator 44, management computer 3 can perform wired communication with tape feeders 8 installed in component mounters M1 to M3 via communicator 45, communicator 35 of component mounters M1 to M3, and component suppliers 7.

In FIG. 11, feeder evaluation value calculator 40a calculates feeder evaluation values Ex and Ey, which are sums of suction position correction values Vcx and Vcy stored in management storage 41 and suction position shift amounts $\Delta Xd$, $\Delta Yd$, and $\Delta \theta d$ for each of tape feeders 8 (component supply devices). Feeder evaluation value calculator 40a calculates feeder evaluation values Ex and Ey each time suction position correction values Vcx and Vcy and suction position shift amounts $\Delta Xd$, $\Delta Yd$, and $\Delta \theta d$ transmitted by each of component mounters M1 to M3, which are in the middle of producing mount boards, are received. Calculated feeder evaluation values Ex and Ey are stored in management storage 41 as feeder evaluation value data 41d. That is, management storage 41 is a feeder evaluation value storage that keeps storing feeder evaluation values Ex and Ey during production.

Feeder evaluation determiner 40b determines a feeder evaluation (feeder rank) of each of tape feeders 8 (component supply devices) based on feeder evaluation values Ex and Ey. More specifically, feeder evaluation determiner 40b calculates range Rx and average value Mx in the X-direction and range Ry and average value My in the Y-direction of feeder evaluation values Ex and Ey. Then, feeder evaluation determiner 40b calculates feeder position shift amounts $\Delta Xf$ and $\Delta Yf$ ($\Delta Xf = Mx + \Delta Xp$ and $\Delta Yf = My + \Delta Yp$) of tape feeders 8 installed on feeder bases 15a by adding pocket position shift amounts $\Delta Xp$ and $\Delta Yp$ to average values Mx and My of feeder evaluation values Ex and Ey.

Based on calculation results, feeder evaluation determiner 40b determines a rank for each of range Rx in the X-direction, range Ry in the Y-direction, feeder position shift amount $\Delta Xf$ in the X-direction, and feeder position shift amount $\Delta Yf$ in the Y-direction of feeder evaluation values Ex and Ey.

Figure 13A:
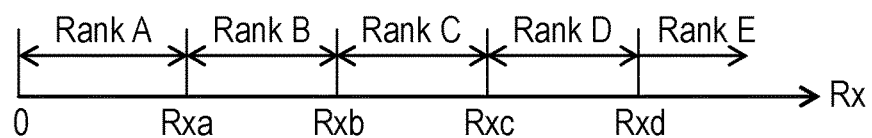
FIG. 13A is a view for illustrating ranks of ranges of the feeder evaluation value in the X-direction of the tape feeder according to the exemplary embodiment of the disclosure.
Figure 13B:
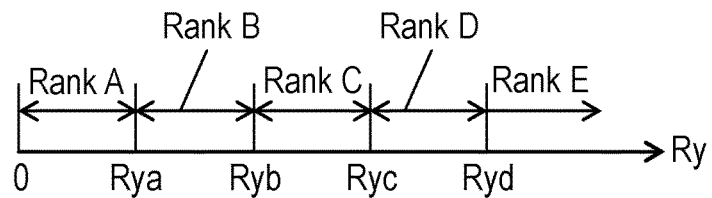
FIG. 13B is a view for illustrating ranks of ranges of a feeder evaluation value in a Y-direction of the tape feeder according to the exemplary embodiment of the disclosure.

Herein, an example of rank assignment determined by feeder evaluation determiner 40b will be described with reference to FIGS. 13A to 13E. In FIG. 13A, ranks are assigned such that rank A is assigned in a case where range Rx in the X-direction is equal to or smaller than Rxa, rank B is assigned in a case where the range is larger than Rxa and is equal to or smaller than Rxb, rank C is assigned in a case where the range is larger than Rxb and is equal to or smaller than Rxc, rank D is assigned in a case where the range is larger than Rxc and is equal to or smaller than Rxd, and rank E is assigned in a case where the range is larger than Rxd, respectively. In FIG. 13B, rank A to rank E are similarly assigned to range Ry in the Y-direction.

Figure 13C:
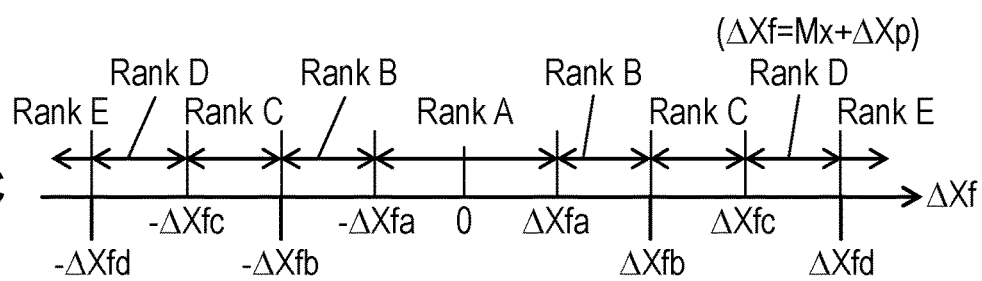
FIG. 13C is a view for illustrating ranks of feeder position shift amounts in the X-direction of the tape feeder according to the exemplary embodiment of the disclosure.
Figure 13D:
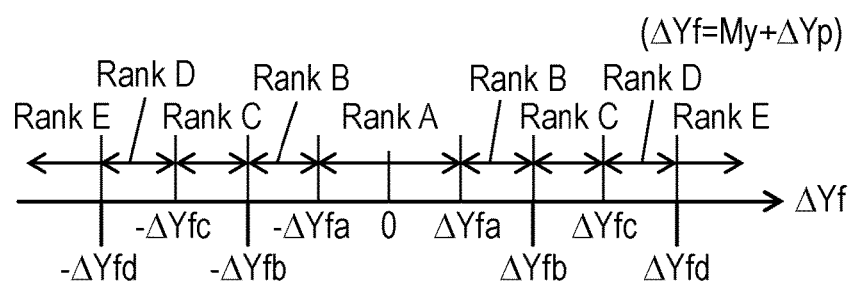
FIG. 13D is a view for illustrating ranks of feeder position shift amounts in the Y-direction of the tape feeder according to the exemplary embodiment of the disclosure.

In FIG. 13C, ranks are assigned such that rank A is assigned in a case where the absolute value of feeder position shift amount $\Delta Xf$ in the X-direction is equal to or smaller than $\Delta Xfa$, rank B is assigned in a case where the absolute value is larger than $\Delta Xfa$ and is equal to or smaller than $\Delta Xfb$, rank C is assigned in a case where the absolute value is larger than $\Delta Xfb$ and is equal to or smaller than $\Delta Xfc$, rank D is assigned in a case where the absolute value is larger than $\Delta Xfc$ and is equal to or smaller than $\Delta Xfd$, and rank E is assigned in a case where the absolute value is larger than $\Delta Xfd$, respectively. In FIG. 13D, rank A to rank E are similarly assigned to feeder position shift amount $\Delta Yf$ in the Y-direction.

Figure 13E:
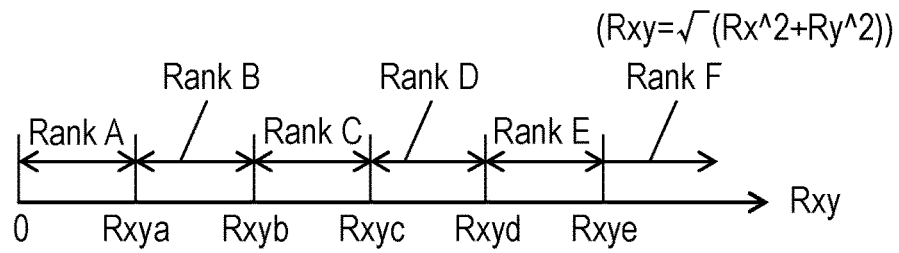
FIG. 13E is a view for illustrating ranks of average ranges of the feeder position shift amounts of the tape feeder according to the exemplary embodiment of the disclosure.

In addition, the root mean square of range Rx in the X-direction and range Ry in the Y-direction, which is average range $Rxy(\sqrt{(Rx^2+Ry^2)})$, is calculated as a comprehensive indicator of the variation range of feeder evaluation values Ex and Ey. In FIG. 13E, ranks are assigned such that rank A is assigned in a case where average range Rxy is equal to or smaller than Rxya, rank B is assigned in a case where the average range is larger than Rxya and is equal to or smaller than Rxyb, rank C is assigned in a case where the average range is larger than Rxyb and is equal to or smaller than Rxyc, rank D is assigned in a case where the average range is larger than Rxyc and is equal to or smaller than Rxyd, rank E is assigned in a case where the average range is larger than Rxyd and is equal to or smaller than Rxye, and rank F is assigned in a case where the average range is larger than Rxye, respectively.

Feeder evaluation determiner 40b determines a feeder evaluation (feeder rank) as described above based on at least any one of variation ranges (ranges Rx and Ry and average range Rxy) of feeder evaluation values Ex and Ey and average values Mx and My of feeder evaluation values Ex and Ey. Various types of ranks determined by feeder evaluation determiner 40b are stored in management storage 41 as feeder evaluation data 41e, are transmitted to corresponding tape feeders 8, and are stored in feeder storage 51 of tape feeders 8 as feeder rank information 51a.

As described above, component mounting system 1 of the exemplary embodiment includes a plurality of component supply devices (tape feeders 8) that supply components D from component supply positions 8a, component mounters 12 that suck components D from component supply positions 8a of the plurality of component supply devices with a plurality of nozzles (suction nozzles 11b) and install the components onto board 6, and feeder evaluation value calculator 40a that calculates feeder evaluation values Ex and Ey, which are sums of suction position correction values Vcx and Vcy and suction position shift amounts ΔXd, ΔYd, and Δθd, for each component supply device. Therefore, the component feeding accuracy of tape feeders 8 (component supply devices) can be evaluated without causing a decline in production efficiency.

Herein, a relationship between the rank of average range Rxy and the size of component D (component D that can be sucked by suction nozzles 11b) that tape feeder 8 can supply while maintaining a predetermined accuracy will be described with reference to FIG. 14. When a variation in the supply position of component D becomes larger on tape feeder 8, the proportion of suction failures, in which small-sized components D cannot be sucked with suction nozzles 11b, increases. Thus, the type (size) of component D, which allows suction failures to be decreased below a predetermined proportion, is determined according to average range Rxy, which is the accuracy of tape feeders 8 supplying components D.

In FIG. 14, all of 0201 components (0.2 mm×0.1 mm), 03015 components (0.3 mm×0.15 mm), 0402 components (0.4 mm×0.2 mm), 0603 components (0.6 mm×0.3 mm), 1005 components (1.0 mm×0.5 mm), and 1608 components (1.6 mm×0.8 mm) are components (components D through which suction failures decrease below a predetermined proportion) applicable to tape feeder 8, of which average range Rxy is rank A having a high accuracy (small variation range) of supplying components D. In the case of rank B, components D larger than 0402 components are applicable components.

In the case of rank C, components D larger than 0603 components are applicable components. In the case of rank D, components D larger than 1005 components are applicable components. In the case of rank E, components D larger than 1608 components are applicable components. In the case of rank F having a low accuracy (large variation range) of supplying components D, all components D are inapplicable. When changing the setup, tape feeders 8 having an appropriate rank are selected according to a component size based on a relationship between the rank of average range Rxy and the applicable component shown in FIG. 14.

In FIG. 11, when changing the setup, feeder rank selector 40c controls such that display 43 displays a feeder selection screen for a worker to select and input a predetermined feeder rank (feeder evaluation) and input 42 inputs (selects) the feeder rank. The selected feeder rank (feeder evaluation) is transmitted to tape feeders 8.

Figure 15A:
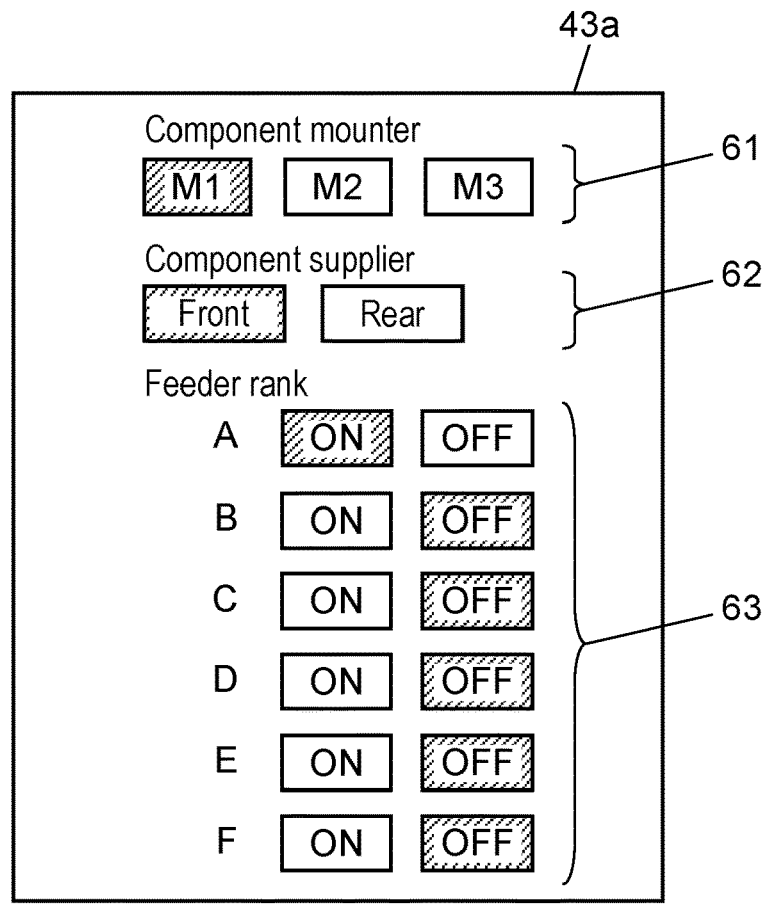
FIG. 15A is a view for illustrating an example of a feeder rank selection screen displayed on a display of the component mounting system according to the exemplary embodiment of the disclosure.

Herein, an example of feeder rank selection screen 43a displayed on display 43 by feeder rank selector 40c will be described with reference to FIG. 15A. In this example, component mounters M1 to M3 configuring component mounting system 1, the disposition position (front and rear) of component supplier 7, and a feeder rank (the rank of average range Rxy) can be selected. "Component mounter" selection button 61, "component supplier" selection button 62, and "feeder rank" selection button 63 are arranged on feeder rank selection screen 43a.

By operating input 42, each of selection buttons 61, 62, and 63 is selected. Herein, selected selection buttons 61, 62, and 63 are obliquely hatched. In FIG. 15A, tape feeders 8, which are installed on component supplier 7 on a front side of component mounter M1 and of which a rank is rank A, are selected. In this manner, feeder rank selector 40c controls such that any feeder rank can be selected out of feeder ranks, which are classified according to the performance of tape feeders 8 (component supply devices) set for each tape feeder 8 (component supply device).

Feeder rank selector 40c may be included in component mounters M1 to M3, and display 34 of component mounters M1 to M3 may display feeder rank selection screen 43a. A feeder rank selected by feeder rank selector 40c is not limited to the rank of average range Rxy of feeder evaluation values Ex and Ey. For example, a feeder rank, which is determined by range Rx in the X-direction, range Ry in the Y-direction, feeder position shift amount ΔXf in the X-direction, and feeder position shift amount ΔYf in the Y-direction of feeder evaluation values Ex and Ey, may be selected.

Next, a configuration of a control system of tape feeder 8 (component supply device) will be described with reference to FIG. 12. Tape feeder 8 includes feeder controller 50, feeder storage 51, tape feed mechanism 20, operation and display panel 8c, wireless communicator 53, and communicator 54. Feeder controller 50 is an arithmetic device such as a CPU, and controls tape feed mechanisms 20 to pitch feed carrier tape 16 in accordance with processing programs and parameters stored in feeder storage 51. In addition, feeder controller 50 includes display controller 50a as an internal processor. Feeder storage 51 is a storage device, and stores feeder rank information 51a.

Wireless communicator 53 transmits and receives a signal and data to and from management computer 3 through wireless communication. That is, wireless communicator 53 performs wireless communication between tape feeder 8 (component supply device) and feeder rank selector 40c of management computer 3. Communicator 54 is a communication interface, and transmits and receives a signal and data to and from component mounters M1 to M3 via component suppliers 7 if tape feeders 8 are installed on component mounters M1 to M3.

In a case where feeder rank information 51a stored in feeder storage 51 matches a feeder rank selected by feeder rank selector 40c, display controller 50a causes displays 52 included in operation and display panels 8c to display the selected feeder rank. That is, display controller 50a causes displays 52 of tape feeders 8 (component supply devices) corresponding to the feeder rank selected by feeder rank selector 40c to display that these tape feeders 8 have the selected feeder rank (component supply device).

Figure 15B:
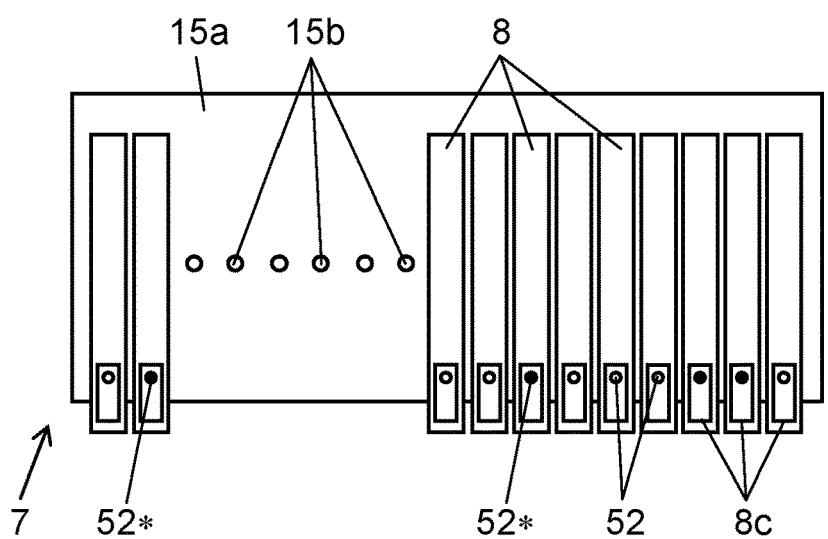
FIG. 15B is a view for illustrating an example of the tape feeder displaying a selected feeder rank in the component mounting system according to the exemplary embodiment of the disclosure.

Herein, an example of displaying that these tape feeders 8 have the feeder rank selected by display controller 50a will be described with reference to FIG. 15B. FIG. 15B illustrates component supplier 7 on the front side of component mounter M1, which is selected through feeder rank selection screen 43a illustrated in FIG. 15A. When a feeder rank is selected by feeder rank selector 40c, displays 52* (herein, LED lamps) of operation and display panels 8c of tape feeders 8 having selected rank A, out of tape feeders 8 installed on feeder base 15a, are turned on (herein, a turned-on state is expressed with a black circle and a turned-off state is expressed with a white circle). Accordingly, a worker can recognize that these tape feeders 8 have the selected feeder rank.

In a case where displays 52 are color-changing LEDs, display controller 50a may cause displays 52 to emit light beams having different colors according to a feeder rank. In a case where displays 52 are liquid crystal display screens that can display characters, display controller 50a may cause displays 52 to display a feeder rank. In addition, display controller 50a may cause displays 52 to flicker at different timings (different flickering patterns) according to a feeder rank. Accordingly, it is possible for a worker to simultaneously identify tape feeders 8 having different feeder ranks.

As described above, component mounting system 1 of the exemplary embodiment includes a plurality of component supply devices (tape feeders 8), displays 52 provided on the plurality of component supply devices, feeder rank selector 40c that can select any feeder rank out of feeder ranks (feeder evaluations), which are classified according to the performance of component supply devices set for each component supply device, and display controller 50a which causes displays 52 of component supply devices corresponding to a feeder rank selected by feeder rank selector 40c to display that the component supply devices have the selected feeder rank. Therefore, a worker can easily identify the ranks of tape feeders 8 (component supply devices).

Next, a component mounting method for component mounting system 1 will be described with the flow of FIG. 16. When tape feeders 8 are replaced and carrier tape 16 is replaced due to a change in the setup accompanying a change in the model of a mount board to be produced by component mounters M1 to M3, board recognition cameras 14 image target pocket 16b* of tape feeder 8 (ST1: pocket imaging step). Next, recognition processor 32 recognition-processes the captured pocket image to calculate pocket position shift amounts ΔXp and ΔYp and stores the pocket position shift amounts in storage 31 as pocket position shift amount data 31b (ST2: pocket position shift amount calculating and storing step). In addition, calculated pocket position shift amounts ΔXp and ΔYp are transmitted to management computer 3 and are also stored in management storage 41 as pocket position shift amount data 41a.

Next, tape feeders 8 pitch feed carrier tape 16 (ST3: tape feeding step). Therefore, components D, which are suction targets, are fed to component supply positions 8a. In a case where components D, which are suction targets, are already at component supply positions 8a, the tape feeding step (ST3) is skipped at this time point. Next, correction value calculator 30b calculates suction position correction values Vcx and Vcy based on stored pocket position shift amounts ΔXp and ΔYp and stores the suction position correction values in storage 31 as suction position correction value data 31d (ST4: suction position correction value calculating and storing step). In addition, calculated suction position correction values Vcx and Vcy are transmitted to management computer 3 and are also stored in management storage 41 as suction position correction value data 41c.

In a case where component mounters M1 to M3 keep mounting components and suction position shift amount data 31c is stored in storage 31, correction value calculator 30b calculates suction position correction values Vcx and Vcy based on stored suction position shift amounts ΔXd, ΔYd, and Δθd and pocket position shift amounts ΔXp and ΔYp, in suction position correction value calculating and storing step (ST4). In this manner, suction position correction values Vcx and Vcy for correcting a suction position shift from the regular suction position when suction nozzles 11b (nozzles) suck components D from component supply positions 8a are calculated.

Figure 16:
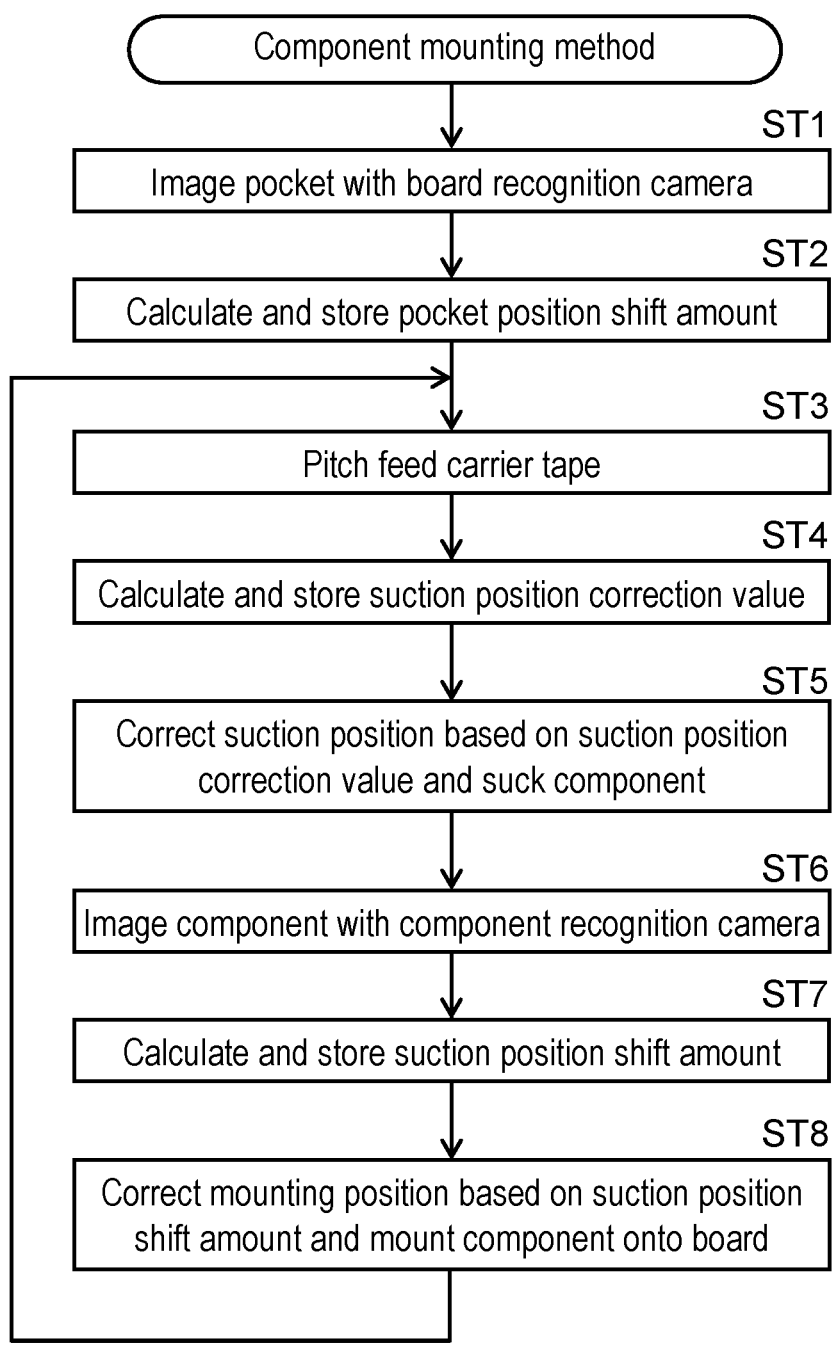
FIG. 16 is a flow chart of a component mounting method for a component mounting system according to the exemplary embodiment of the disclosure.

In FIG. 16, next, mounting controller 30a corrects the suction positions for suction nozzles 11b to suck components D based on stored suction position correction values Vcx and Vcy (ST5: component sucking step). Next, suction nozzles 11b suction holding components D move above component recognition cameras 13 and component recognition cameras 13 image components D (ST6: component imaging step).

Next, recognition processor 32 recognition-processes captured component recognition image 13a to calculate suction position shift amounts ΔXd, ΔYd, and Δθd and stores the suction position shift amounts in storage 31 as suction position shift amount data 31c (ST7: suction position shift amount calculating and storing step). In addition, calculated suction position shift amounts ΔXd, ΔYd, and Δθd are transmitted to management computer 3 and are also stored in management storage 41 as suction position shift amount data 41b. In this manner, suction position shift amounts ΔXd, ΔYd, and Δθd from the regular suction position are calculated.

Next, mounting controller 30a corrects the mounting position based on stored suction position shift amounts ΔXd, ΔYd, and Δθd to mount components D onto board 6 (ST8: component mounting step). When all components D held by mounting heads 11 are mounted on board 6, it is switched over to the next mounting turn and processing returns to the tape feeding step (ST3) in which components D on tape feeders 8 to be mounted next are pitch fed to component supply positions 8a. In the suction position correction value calculating and storing step (ST4), suction position correction values Vcx and Vcy for mounting the next components are calculated based on previously acquired suction position shift amounts ΔXd, ΔYd, and Δθd.

Next, an evaluation method of a component supply device (tape feeder 8) in component mounting system 1 will be described with the flow of FIG. 17. When component mounting system 1 keeps mounting aforementioned components, each piece of data such as pocket position shift amounts ΔXp and ΔYp, suction position shift amounts ΔXd, ΔYd, and Δθd, suction position correction values Vcx and Vcy is accumulated in turn in management computer 3, and the evaluation of component supply devices to be described below is executed.

First, feeder evaluation value calculator 40a of management computer 3 calculates feeder evaluation values Ex and Ey, which are sums of suction position correction values Vcx and Vcy and suction position shift amounts ΔXd, ΔYd, and Δθd, for each tape feeder 8 (component supply device) based on suction position shift amount data 41b and suction position correction value data 41c stored in management storage 41, and stores the feeder evaluation values in management storage 41 as feeder evaluation value data 41d (ST11: feeder evaluation value calculating and storing step). Next, feeder evaluation determiner 40b determines whether or not a predetermined number of feeder evaluation values Ex and Ey are accumulated (ST12: accumulated number determining step).

Until the predetermined number of feeder evaluation values Ex and Ey are accumulated (No in ST12), feeder evaluation values Ex and Ey are calculated and stored in the feeder evaluation value calculating and storing step (ST11). When the predetermined number of feeder evaluation values Ex and Ey are accumulated (Yes in ST12), feeder evaluation determiner 40b calculates ranges Rx and Ry (variation ranges) and average values Mx and My of feeder evaluation values Ex and Ey (ST13).

Figure 17:
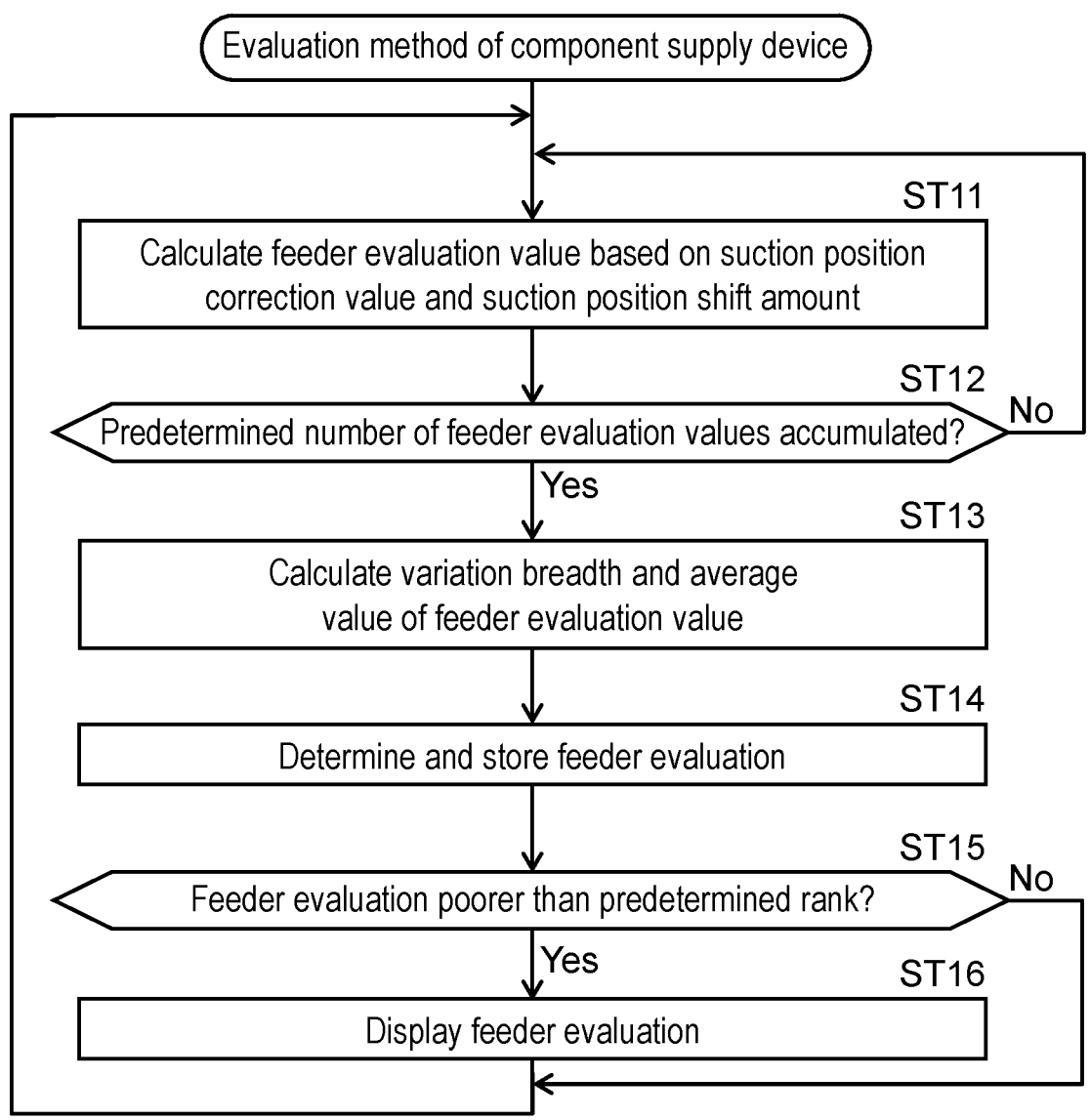
FIG. 17 is a flow chart of an evaluation method of a component supply device in the component mounting system according to the exemplary embodiment of the disclosure.

In FIG. 17, next, feeder evaluation determiner 40b determines a feeder evaluation (feeder rank) of aforementioned tape feeder 8 (component supply device) based on at least any one of ranges Rx and Ry (variation ranges) of feeder evaluation values Ex and Ey and average values Mx and My of feeder evaluation values Ex and Ey, and stores the evaluation in management storage 41 as feeder evaluation data 41e (ST14: feeder evaluation determining and storing step). In addition, the determined feeder evaluation (feeder rank) is transmitted to tape feeder 8 and is also stored in feeder storage 51 of tape feeder 8 as feeder rank information 51a.

In this manner, feeder evaluation determiner 40b determines a feeder evaluation each time the predetermined number of feeder evaluation values Ex and Ey are accumulated in management storage 41. For example, the number of components D supplied by tape feeders 8 while sprocket 21 rotates one time is selected as the predetermined number. Accordingly, even in a case where sprocket 21 is distorted and there is a bias in the supply position of component D, a bias (error) of ranges Rx and Ry and average values Mx and My of feeder evaluation values Ex and Ey caused due to the calculation timings of feeder evaluation values Ex and Ey can be reduced.

In FIG. 17, next, feeder evaluation determiner 40b determines whether or not the determined feeder evaluation (feeder rank) is poorer than a predetermined rank (ST15: rank determining step).

In a case where the feeder evaluation is poorer than the predetermined rank (Yes in ST15), feeder evaluation determiner 40b causes display 43 to display information specifying this tape feeder 8 (installed component mounters M1 to M3, component supplier 7 on the front or on the rear, and an installation position on feeder base 15a) and the feeder evaluation (feeder rank) as maintenance information (ST16: maintenance information displaying step). Feeder evaluation determiner 40b includes a notifier that gives a worker a notification which suggests maintenance of tape feeder 8, of which a feeder evaluation falls short of the predetermined rank, out of the plurality of tape feeders 8.

The predetermined rank is determined based on a relationship between a feeder rank and an applicable component of FIG. 14. For example, when a variation in the supply position of component D becomes larger due to wear of a movable portion and tape feeders 8, which supply 0603 components and have rank B, are assigned with rank C, which is an applicable lower limit, maintenance information is displayed in the maintenance information displaying step (ST16). Accordingly, a worker can easily know that time for maintenance of tape feeders 8 is close at hand. In addition, when the feeder ranks of tape feeders 8 becomes rank D which falls short of the applicable lower limit, component mounting work by component mounters M1 to M3 may be stopped in order for a worker (maintenance personnel) to check the condition.

In FIG. 17, next, processing returns to the feeder evaluation value calculating and storing step (ST11), and feeder evaluation values Ex and Ey are calculated based on accumulated data. In a case where the feeder evaluation is not poorer than the predetermined rank (No in ST15), the maintenance information displaying step (ST16) is skipped and processing returns to the feeder evaluation value calculating and storing step (ST11).

In this manner, additional work for a feeder evaluation in component mounting work by component mounters M1 to M3 is not necessary, and a feeder evaluation is determined by management computer 3 while component mounting work is being performed. For this reason, a feeder evaluation (feeder rank) can be determined according to the component feeding accuracy of tape feeders 8 (component supply devices) without causing a decline in mount board production efficiency of component mounting system 1. Component mounters M1 to M3 may include feeder evaluation value calculator 40a and feeder evaluation determiner 40b, and display 34 of component mounters M1 to M3 may display maintenance information.

As described above, in the evaluation method of a component supply device (tape feeder 8) in component mounting system 1 of the exemplary embodiment, suction position correction values Vcx and Vcy for correcting a suction position shift from the regular suction position when suction nozzles 11b suck components D from component supply positions 8a are calculated (ST4), the suction position is corrected based on suction position correction values Vcx and Vcy to suck components D (ST5), suction position shift amounts $\Delta Xd$, $\Delta Yd$, and $\Delta \theta d$ from the regular suction position are calculated (ST7), and feeder evaluation values Ex and Ey, which are sums of suction position correction values Vcx and Vcy and suction position shift amounts $\Delta Xd$, $\Delta Yd$, and $\Delta \theta d$, are calculated for each component supply device (ST11). Therefore, the component feeding accuracy of component supply devices (tape feeders 8) can be evaluated without causing a decline in production efficiency.

The component mounting system and the evaluation method of a component supply device of the disclosure have an effect, in which the component feeding accuracy of the component supply device can be evaluated without causing a decline in production efficiency, and are useful in the field of mounting components onto a board.

What is claimed is:

1. A component mounting system comprising:
a plurality of component supply devices each of which has a component supply position and supplies components from the component supply position;
a component mounter that has a plurality of nozzles and sucks the components from the component supply position of each of the plurality of component supply devices with the plurality of nozzles to install the components onto a board;
a feeder evaluation value calculator that calculates a feeder evaluation value, which is a sum of a suction position correction value for correcting a suction position shift from a regular suction position when each of the nozzles sucks the components from the component supply position and a suction position shift amount from the regular suction position when the suction position shift is corrected based on the suction position correction value and the components are sucked, for each of the plurality of component supply devices; and a feeder evaluation determiner that determines a feeder evaluation of each of the plurality of component supply devices based on the feeder evaluation value, wherein the plurality of component supply devices each include a display, and wherein the component mounting system further comprises:

a feeder rank selector that can select the feeder evaluation, and a display controller that causes a display of a component supply device corresponding to a feeder evaluation selected by the feeder rank selector, out of the plurality of component supply devices, to display that the component supply device corresponding to the selected feeder evaluation has the selected feeder evaluation.

2. The component mounting system of claim 1, wherein the feeder evaluation determiner determines the feeder evaluation based on at least one of a variation range of a plurality of the feeder evaluation value and an average value of a plurality of the feeder evaluation value.

3. The component mounting system of claim 1, further comprising:

a feeder evaluation value storage that keeps storing the feeder evaluation value during production, wherein the feeder evaluation determiner determines the feeder evaluation each time a predetermined number of feeder evaluation values are accumulated in the feeder evaluation value storage.

4. The component mounting system of claim 1, wherein the feeder evaluation determiner includes a notifier that gives a worker a notification which suggests maintenance of a component supply device, of which the feeder evaluation falls short of a predetermined rank, out of the plurality of component supply devices.

5. The component mounting system of claim 1, further comprising:

a correction value calculator that calculates the suction position correction value for each combination of each of the plurality of nozzles and each of the plurality of component supply devices.

6. The component mounting system of claim 1, further comprising:

a wireless communicator that performs wireless communication between the plurality of component supply devices and the feeder rank selector.

7. The component mounting system of claim 1, wherein the display controller causes the display to emit light beams having different colors according to the feeder evaluation.

8. The component mounting system of claim 1, wherein the display controller causes the display to display the feeder evaluation.

9. The component mounting system of claim 1, wherein the display controller causes the display to flicker at different timings according to the feeder evaluation.

* * * * *